(12) United States Patent
Peting et al.

(10) Patent No.: US 12,166,456 B2
(45) Date of Patent: Dec. 10, 2024

(54) LOOP FILTER STABILIZATION FOR CLASS D AMPLIFIER

(71) Applicant: SKYWORKS SOLUTIONS, INC., Irvine, CA (US)

(72) Inventors: Mark R. Peting, Yamhill, OR (US);
Wai Laing Lee, Portland, OR (US);
Miles Reuben Thompson, Portland, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 70 days.

(21) Appl. No.: 17/955,637

(22) Filed: Sep. 29, 2022

(65) Prior Publication Data

US 2023/0097106 A1 Mar. 30, 2023

Related U.S. Application Data

(60) Provisional application No. 63/306,134, filed on Feb. 3, 2022, provisional application No. 63/250,707, filed on Sep. 30, 2021.

(51) Int. Cl.
*H03F 99/00* (2009.01)
*H03F 3/217* (2006.01)
*H04R 3/00* (2006.01)

(52) U.S. Cl.
CPC .............. *H03F 3/217* (2013.01); *H04R 3/00* (2013.01); *H03F 2200/03* (2013.01)

(58) Field of Classification Search
CPC .......... H03F 3/217; H03F 3/187; H03M 1/46; H03M 1/50; H03M 1/82; H04R 3/00
See application file for complete search history.

(56) References Cited

U.S. PATENT DOCUMENTS

| | | | |
|---|---|---|---|
| 5,777,512 A | 7/1998 | Tripathi et al. | |
| 6,998,910 B2 | 2/2006 | Hezar et al. | |
| 7,058,464 B2 | 6/2006 | Mallinson | |
| 7,200,187 B2 | 4/2007 | O'Brien | |
| 7,649,958 B2 | 1/2010 | Macphail et al. | |
| 9,768,799 B1 | 9/2017 | Yoo et al. | |
| 11,250,830 B2 | 2/2022 | Wurtz | |
| 2015/0155836 A1* | 6/2015 | Midya | H03F 1/3241 330/291 |
| 2016/0308577 A1 | 10/2016 | Molina et al. | |
| 2017/0294888 A1* | 10/2017 | Berkhout | H03F 3/2175 |
| 2019/0007010 A1* | 1/2019 | Høyerby | H03F 3/2173 |

(Continued)

*Primary Examiner* — Simon King
(74) *Attorney, Agent, or Firm* — Lando & Anastasi, LLP

(57) ABSTRACT

Amplifying a signal includes outputting an output signal from a Class D amplifier configured to operate as a current driver to a load, such as a loudspeaker, the output of the Class D amplifier controlled by a feedback loop, and, in the feedback loop: performing analog filtering using an active analog filter on an error signal that is based on the output of the Class D amplifier and a reference signal, digitizing a filtered output of the analog filter to produce a sequence of digital values, performing digital filtering on the sequence of digital values to produce a sequence of filtered digital values, and generating a pulse signal to control the output of the Class D amplifier based on the sequence of filtered digital values. The digital filter reduces a destabilizing effect of the loudspeaker's inductance. Associated circuits, systems, modules and electronic devices are disclosed.

25 Claims, 13 Drawing Sheets

(56) References Cited

U.S. PATENT DOCUMENTS

| | | | |
|---|---|---|---|
| 2020/0228076 A1* | 7/2020 | Lee | ........................ H03F 3/187 |
| 2021/0203287 A1 | 7/2021 | Kinyua et al. | |
| 2022/0308613 A1 | 9/2022 | Zanbaghi et al. | |
| 2022/0345149 A1 | 10/2022 | Bal et al. | |
| 2023/0058434 A1* | 2/2023 | Yang | ..................... H03F 3/2173 |
| 2023/0101927 A1 | 3/2023 | Peting | |
| 2023/0247354 A1 | 8/2023 | Sakai | |
| 2024/0030930 A1 | 1/2024 | Lee | |

* cited by examiner

LOOP FILTER STABILIZATION FOR CLASS D AMPLIFIER

CROSS-REFERENCE TO RELATED APPLICATIONS

This application claims priority under 35 U.S.C. § 119(e) to U.S. Provisional patent application Ser. No. 63/250,707, titled "LOOP FILTER STABILIZATION FOR CLASS D AMPLIFIER," filed Sep. 30, 2021, and to U.S. Provisional patent application Ser. No. 63/306,134, titled "LOOP FILTER STABILIZATION FOR CLASS D AMPLIFIER" filed Feb. 3, 2022, each of which is incorporated by reference in their entirety for all purposes.

BACKGROUND

Field

Aspects and embodiments of the present disclosure relate to amplifier circuits and particularly to amplifier circuits for audio applications.

Description of the Related Technology

In many audio applications, sound provided by a loudspeaker results from an audio signal being amplified by an amplifier, and the amplified audio signal being provided to the loudspeaker. When implemented in a low power audio device, such as a portable audio product having a limited power source (e.g., a battery), multiple voltage supply levels may be provided to the amplifier so that the operating voltage supply of the amplifier can be selected based on the audio signal to be amplified to allow a longer operating period with the limited power source.

In a Class D, or switching amplifier, a number of pulses are generated by a modulator of a fixed amplitude but varying width and separation (or a varying number per unit time) representing the amplitude variations of an analog or digital audio input signal. Conventionally, the modulator compares analog voltages against a particular waveform, usually a triangular waveform, to decide how wide a pulse of a digital signal should be. The output of the modulator is then used to gate output transistors on and off alternately to use as the signal for driving the loudspeakers. A low-pass filter may be used to provide a path for the low frequencies of the audio signal to output to loudspeakers of the low power audio device while filtering out the high frequency pulses of the modulator.

Class D amplifiers may be used with loop feedback, where the output of the amplifier is compared with a reference signal to be amplified (subject to a scaling factor according to the degree of amplification) to generate an error signal, which the modulator uses to control the amplifier output. It should be appreciated that class-D amplifiers are not limited to use in audio applications, as class-D amplifiers may be used in other applications, such as cellular and wireless LAN communications equipment, as discussed further below.

SUMMARY

According to an aspect of the present disclosure, there is provided an audio amplifier circuit. The audio amplifier circuit comprises a Class D amplifier configured to operate as a current driver, the Class D amplifier having an output for coupling to a loudspeaker; an analog loop filter to perform active filtering on an error signal that is based on the output of the Class D amplifier and a reference signal, the analog loop filter producing a filtered output; an analog-to-digital converter to produce a sequence of digital values based on the filtered output of the analog loop filter; a digital loop filter to perform digital filtering on the sequence of digital values to produce a sequence of filtered digital values; and a pulse generator configured to provide a pulse signal to the Class D amplifier to control the output of the Class D amplifier based on the sequence of filtered digital values.

In some examples, the analog loop filter is configured to perform amplification and low-pass filtering. Alternatively or additionally the digital loop filter may be configured to perform one or both of amplification and phase adjustment over a frequency range. The digital loop filter may be configured to provide a phase adjustment, when the output of the Class D amplifier is coupled to a loudspeaker, to reduce an effect of a phase adjustment arising from an inductance of the loudspeaker. The digital loop filter may be configured to provide an amplification over a frequency range, when the output of the Class D amplifier is coupled to a loudspeaker, reduce the effect of an impedance arising from the inductance of the loudspeaker over the frequency range. The frequency range may be greater than one or more of: 20 KHz, 30 KHz, 40 KHz, 50 KHz, 60 KHz, 70 KHz, 80 KHz, 90 KHz, 100 KHz, 150 KHz, 200 KHz, 300 KHz, and 500 KHz.

Optionally, the audio amplifier may be configured to amplify a digital audio signal that includes a plurality of digital sample values associated with a sampling frequency, and a lower bound of the frequency range over which the digital loop filter is configured to perform one or both of amplification and phase adjustment may be greater than the sampling frequency. In some examples the sampling frequency is one of: 8 KHz, 11.025 KHz, 16 KHz, 32 KHz, 44.056 KHz, 44.1 KHz, 48 KHz, and 96 KHz.

In some examples the lower bound of the frequency range over which the digital loop filter is configured to perform one or both of amplification and phase adjustment is greater than a multiple of the sampling frequency, the multiple of the sampling frequency being one of: 1.25, 1.5, 1.75, 2, 2.5, 3, 5, 10, 15, or 20.

In some examples the analog-to-digital converter, the digital loop filter and the pulse generator are configured to operate at a loop frequency that is greater than the sampling frequency, where the loop frequency may optionally be between 500 KHz and 1 MHz or between 1 MHz and 1.5 MHz or between 1.5 and 2 MHz or between 2 MHz and 2.5 MHz or between 2.5 and 3 MHz or between 3 MHz and 4 MHz or between 4 MHz and 5 MHz or between 5 MHz and 7 MHz or between 7 MHz and 10 MHz or between 10 MHz and 20 MHz or between 20 MHz and 50 MHz.

In some examples the loop frequency is approximately 3 MHz.

In some examples the loop frequency is greater than a multiple of the sampling frequency, the multiple being one or more of: 5, 10, 20, 50, 100, 150, or 200. In some examples an upper bound of the frequency range over which the digital loop filter is configured to perform one or both of amplification and phase adjustment is less than 50% of the loop frequency, such as less than one or more of: 2.5% of the loop frequency, 5% of the loop frequency, 10% of the loop frequency, 15% of the loop frequency, 20% of the loop frequency, 25% of the loop frequency, 30% of the loop frequency, 35% of the loop frequency, 40% of the loop frequency, or 45% of the loop frequency.

In some examples an upper bound of the frequency range over which the digital loop filter is configured to perform one or both of amplification and phase adjustment may be greater than or equal to an upper bound of a frequency range over which the analog loop filter has a gain that is greater than unity.

Alternatively or additionally the Class D amplifier may be configured to operate in a plurality of operating modes including a current driving operating mode in which the Class D amplifier has a relatively high output resistance and a voltage driving operating mode in which the Class D amplifier has a relatively low output resistance, the operating mode of the Class D amplifier being selectable. The plurality of operating modes may include one or more intermediate modes in which the Class D amplifier has an output resistance that is intermediate between the relatively high output resistance of the current driving operating mode and the relatively low output resistance of the voltage driving operating mode. The digital loop filter may be configured to perform different digital loop filtering depending on the operating mode in which the Class D amplifier is configured to operate. In particular, the digital loop filter may be configured not to perform digital loop filtering if the Class D amplifier is configured to operate in the voltage driving operating mode.

Alternatively or additionally the digital loop filter and the Class D amplifier may each be configured to receive a mode selection signal to control filtering behavior of the digital loop filter and the operating mode of the Class D amplifier.

In some examples the digital loop filter includes one or more finite impulse response (FIR) filters that perform digital filtering based on a plurality of coefficient values. The digital loop filter may be configured to select coefficient values for the one or more FIR filters based on the operating mode of the Class D amplifier. In some examples the one or more FIR filters include a three-tap FIR filter or an FIR filter of at least three taps. Alternatively or additionally the one or more FIR filters may include a five-tap FIR filter or an FIR filter of at least five taps. The one or more FIR filters may include a sparse FIR filter such as a sparse five-tap FIR filter or sparse FIR filter of at least five taps. Alternatively or additionally the digital loop filter may include one or more infinite impulse response (IIR) filters, which may be configured for one or more of: low-pass filtering, high-pass filtering, band-pass filtering, and band-stop filtering.

In some examples a plurality of coefficient values for one or more FIR filters and/or one or more IIR filters are determined based on the inductance of a particular loudspeaker to be coupled to the output of the Class D amplifier. Alternatively the plurality of coefficient values may be determined by an optimization process based on minimizing a total noise level in the amplifier output while maintaining a minimum phase margin for stability of the analog loop filter while the output of the Class D amplifier is coupled to a loudspeaker.

In some examples the analog loop filter includes one or more operational amplifiers configured as integrators. The analog loop filter may be a fifth-order filter including a sequence of five operational amplifiers configured as integrators.

In some examples the Class D amplifier is an H Bridge having a dual rail output to separately output positive and negative amplified signal values.

In some examples the output of the Class D amplifier is coupled to a loudspeaker.

In some examples the pulse signal is a pulse width modulation (PWM) signal.

In some examples the error signal may be indicative of a degree to which the output of the Class D amplifier is not providing the desired amplification of the reference signal, such as a difference between the Class D amplifier output and the reference signal with the signals scaled appropriately for comparison, such as by scaling down the Class D amplifier output by a desired amplification factor.

According to a further aspect of the present disclosure there is provided a module comprising any of the above-described audio amplifier circuits.

According to a further aspect of the present disclosure there is provided an electronic device comprising a loudspeaker and any of the above-described amplifier circuits. An electronic device may comprise: a loudspeaker; a Class D amplifier configured to operate as a current driver, the Class D amplifier having an output coupled to a loudspeaker; an analog loop filter to perform active filtering on an error signal that is based on the output of the Class D amplifier and a reference signal, the analog loop filter producing a filtered output; an analog-to-digital converter to produce a sequence of digital values based on the filtered output of the analog loop filter; a digital loop filter to perform digital filtering on the sequence of digital values to produce a sequence of filtered digital values; and a pulse generator configured to provide a pulse signal to the Class D amplifier to control the output of the Class D amplifier based on the sequence of filtered digital values. The electronic device may further comprise a wireless interface for receiving an audio signal to be amplified and then output by the loudspeaker of the electronic device.

According to a further aspect of the preset disclosure there is provided a method for amplifying an audio signal. The method comprises outputting an output signal from a Class D amplifier configured to operate as a current driver to a loudspeaker coupled to the Class D amplifier, the output of the Class D amplifier controlled by a feedback loop; in the feedback loop, performing analog filtering using an active analog filter on an error signal that is based on the output of the Class D amplifier and a reference signal; in the feedback loop, digitizing a filtered output of the analog filter to produce a sequence of digital values; in the feedback loop, performing digital filtering on the sequence of digital values to produce a sequence of filtered digital values; and in the feedback loop, generating a pulse signal to control the output of the Class D amplifier based on the sequence of filtered digital values.

In some examples performing analog filtering includes performing amplification and low-pass filtering. Alternatively or additionally performing digital filtering may include performing one or both of amplification and phase adjustment over a frequency range. Performing digital filtering may include performing phase adjustment over a frequency range to reduce an effect of a phase adjustment arising from an inductance of the loudspeaker. Performing digital filtering may additionally or alternatively include performing amplification over a frequency range to reduce an effect of an impedance arising from the inductance of the loudspeaker over the frequency range. The frequency range may be greater than one or more of: 20 KHz, 30 KHz, 40 KHz, 50 KHz, 60 KHz, 70 KHz, 80 KHz, 90 KHz, 100 KHz, 150 KHz, 200 KHz, 300 KHz, and 500 KHz.

In some examples the audio signal is a digital audio signal that includes a plurality of digital sample values associated with a sampling frequency, and a lower bound of the frequency range over which the one or both of amplification and phase adjustment is performed in the digital filtering is greater than the sampling frequency. In some examples the sampling frequency is one of: 8 KHz, 11.025 KHz, 16 KHz, 32 KHz, 44.056 KHz, 44.1 KHz, 48 KHz, and 96 KHz. In some examples the lower bound of the frequency range over which the one or both of amplification and phase adjustment is performed in the digital filtering is greater than a multiple of the sampling frequency, the multiple being one or more of: 1.25, 1.5, 1.75, 2, 2.5, 3, 5, 10, 15, or 20.

In some examples digitizing, performing digital filtering, and generating the pulse signal includes digitizing, performing digital filtering, and generating the pulse signal at a loop frequency that is greater than the sampling frequency.

In some examples the loop frequency is between 500 KHz and 1 MHz or between 1 MHz and 1.5 MHz or between 1.5 and 2 MHz or between 2 MHz and 2.5 MHz or between 2.5 and 3 MHz or between 3 MHz and 4 MHz or between 4 MHz and 5 MHz or between 5 MHz and 7 MHz or between 7 MHz and 10 MHz or between 10 MHz and 20 MHz or between 20 MHz and 50 MHz.

In some examples the loop frequency is approximately 3 MHz.

In some examples the loop frequency is greater than a multiple of the sampling frequency, the multiple being one of: 2, 5, 10, 20, 50, 100, 150, or 200.

In some examples an upper bound of the frequency range over which the one or both of amplification and phase adjustment is performed in the digital filtering is less than 50% of the loop frequency such as less than one or more of: 2.5% of the loop frequency, 5% of the loop frequency, 10% of the loop frequency, 15% of the loop frequency, 20% of the loop frequency, 25% of the loop frequency, 30% of the loop frequency, 35% of the loop frequency, 40% of the loop frequency, or 45% of the loop frequency.

In some examples an upper bound of the frequency range over which the one or both of amplification and phase adjustment is performed in the digital filtering is greater than or equal to an upper bound of a frequency range over which the analog loop filter has a gain that is greater than unity.

In some examples the Class D amplifier is configured to operate in a plurality of operating modes including a current driving operating mode in which the Class D amplifier has a relatively high output resistance and a voltage driving operating mode in which the Class D amplifier has a relatively low output resistance, the operating mode of the Class D amplifier being selectable.

In some examples the method may comprise changing the operating mode of the Class D amplifier to a different operating mode than the current driving operating mode; and performing digital filtering differently when the Class D amplifier is operating in the different operating mode than when the Class D amplifier is operating in the current driving operating mode. Changing the operating mode of the Class D amplifier may comprise changing the operating mode to the voltage driving operating mode. Performing digital filtering differently when the class D amplifier is operating in the voltage driving operating mode may include performing a lower amount of one or both of amplification and phase adjustment than when the Class D amplifier is operating in the current driving mode.

The plurality of operating modes may further include one or more intermediate modes in which the Class D amplifier has an output resistance that is intermediate between the relatively high output resistance of the current driving operating mode and the relatively low output resistance of the voltage driving operating mode. The method may further comprise: changing the operating mode of the Class D amplifier from the current driving operating mode to an intermediate operating mode.

In some examples performing digital filtering includes performing digital filtering using one or both of an finite impulse response (FIR) filter and an infinite impulse response (IIR) filter that multiply values of the sequence of digital values by coefficient values and performing digital filtering differently when the Class D amplifier is operating in the different operating mode than when the Class D amplifier is operating in the current driving operating mode includes selecting different coefficient values for the FIR filter or IIR filter when the Class D amplifier is operating in the different operating mode from coefficient values used when the Class D amplifier is operating in the current driving operating mode.

In some examples the pulse signal is a pulse width modulation (PWM) signal.

In some examples the error signal is indicative of a degree to which the output of the Class D amplifier is not providing the desired amplification of the reference signal, such as a difference between the Class D amplifier output and the reference signal with the signals scaled appropriately for comparison, such as by scaling down the Class D amplifier output by a desired amplification factor Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
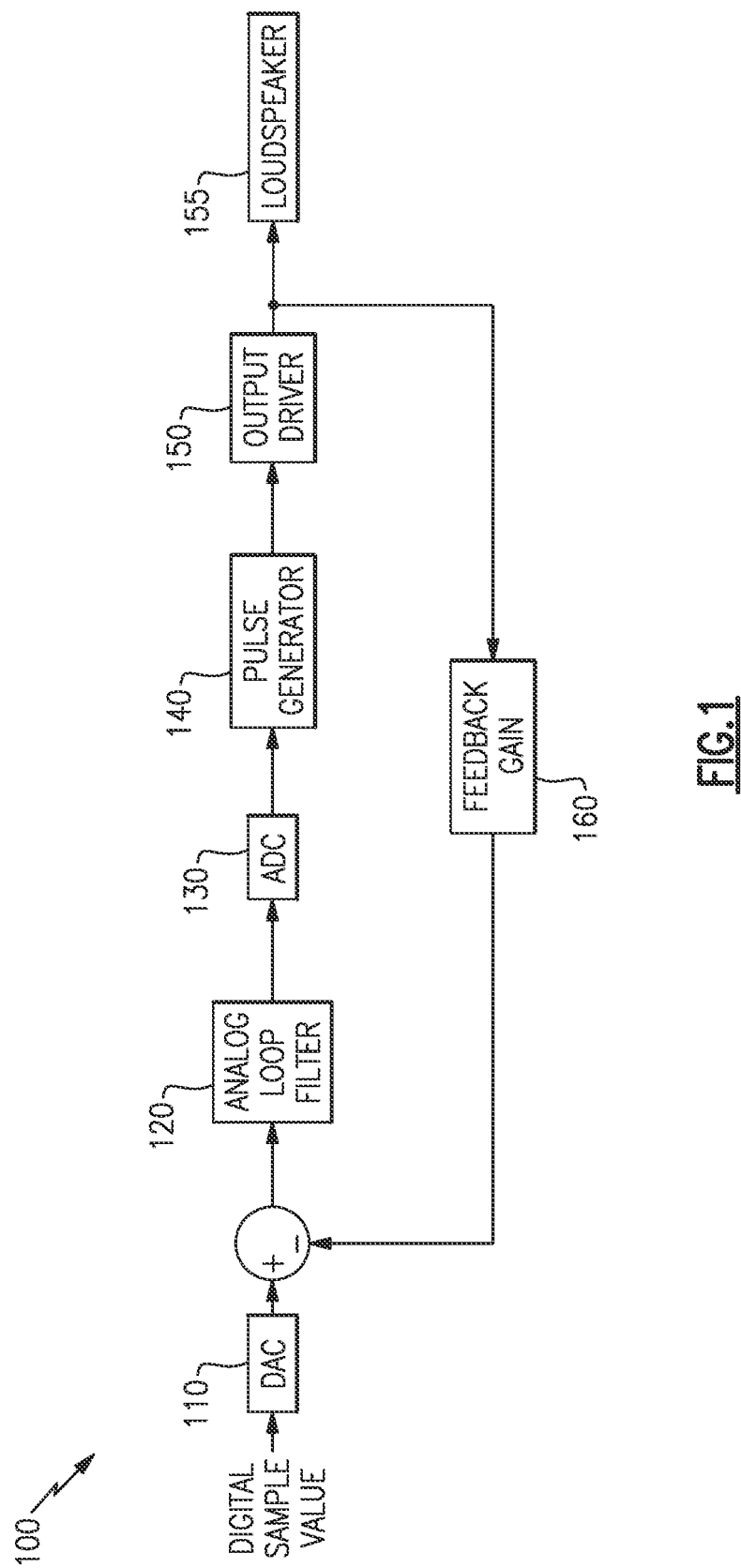
FIG. 1 is a block diagram of a feedback-controlled amplifier.

Aspects and embodiments described herein are directed to a feedback-controlled Class D amplifier for audio applications and other applications with improved stability and noise performance, particularly when operating in a high output resistance mode, i.e., a current driving mode. The feedback loop of the Class D amplifier may digitize the output of an analog loop filter and generate a pulse train or pulse signal (e.g., pulse width modulation signal) for controlling the switching behavior. It has been found that the impedance of a load, such as a loudspeaker load, and particularly the inductance of a loudspeaker load, may in some circumstances destabilize the feedback loop by adding a phase shift into the loop to the point of making the feedback control non-functional for impedances and inductances of some loudspeakers. The inductance of the loudspeaker may introduce extra phase shift into sampled output values of the Class D amplifier that are sent back to a pulse generator of the Class D amplifier in the feedback loop. The inductance of the loudspeaker may also introduce a low-pass effect, reducing gain of the amplifier at higher frequencies. A similar phase shift can occur in other applications, such as where a Class D amplifier is driving a miss-matched antenna load.

To address this problem, the techniques of this disclosure provide a digital loop filter to, for example, remove the phase shift introduced by the loudspeaker load and/or minimize noise amplification. The digital loop filter may reduce a destabilizing effect of the loudspeaker's inductance as compared to a purely analog loop filter used in feedback. It has been found that the inclusion of such a digital loop filter in the feedback loop is able to increase loop stability or restore loop stability in a system that would otherwise be unstable. It has further been found that the inclusion of such a digital loop filter does not introduce any adverse effects. The digital loop filter may not be needed for stability when the Class D amplifier is not operating in a high output resistance mode, such as when the Class D amplifier is operating in a voltage driving mode. Even though it might not be needed, in some implementations the same digital loop filter is used when operating in a voltage driving mode as when operating in a current driving mode. In other implementations the digital loop filter is bypassed or otherwise controlled when operating in a voltage driving mode to provide different filtering such as provide no filtering at all or a lower degree of filtering than when operating in a current driving mode.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIG. 1 is a block diagram of an amplifier 100 that does not include the techniques of this disclosure but represents an amplifier to which the techniques of this disclosure may be applied. The amplifier 100 can receive a digital signal, represented in FIG. 1 by the digital sample value for a particular time instance of the digital signal, and provide a driving signal for a loudspeaker 155. A pulse generator 140 generates a pulse train which is received at an output driver 150. The pulse train controls the gating of transistors in the output driver 150 to produce an output based on the pulse train, which is received at the loudspeaker 155.

Figure 2:
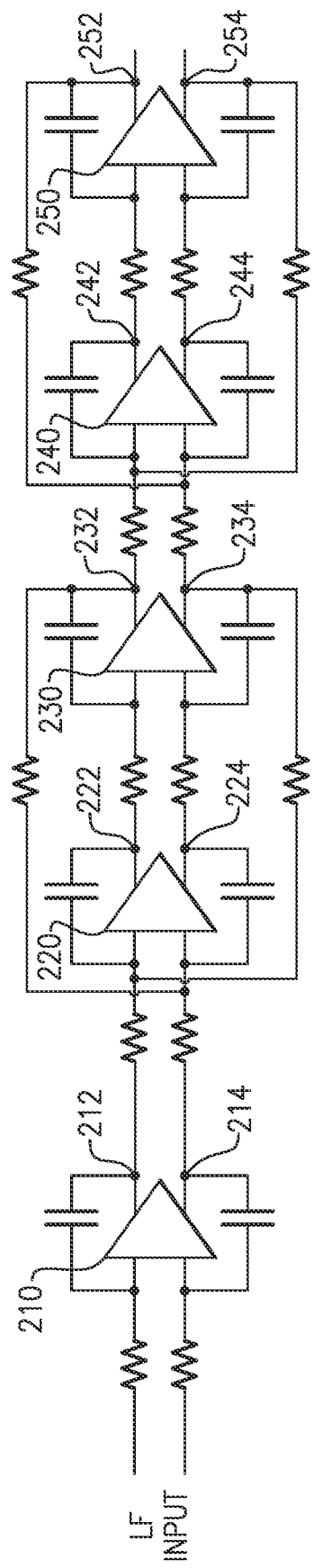
FIG. 2 is a schematic diagram of a portion of an analog loop filter circuit.
Figure 3:
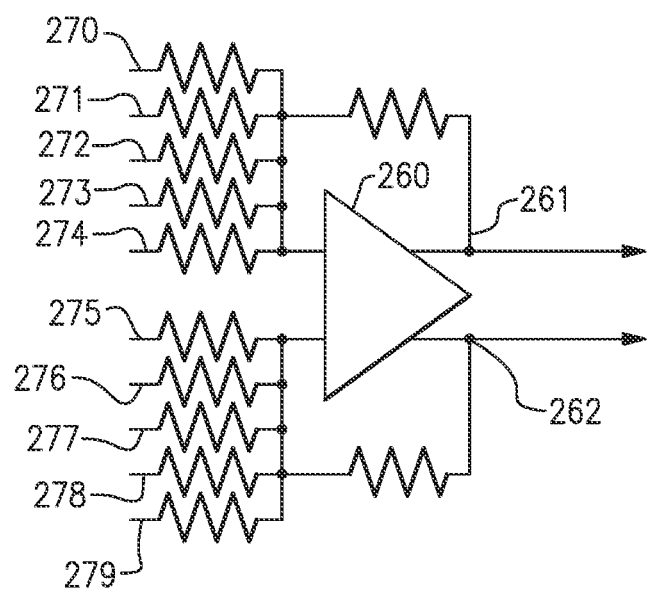
FIG. 3 is a schematic diagram of a further portion of the analog loop filter circuit.

The digital sample value is received at a digital-to-analog converter (DAC) 110. The output of the DAC 110 is combined with feedback from the output of the output driver 150 to produce an error signal. The error signal is equal to the output of the output driver 150 scaled down by a feedback gain 160 according to a desired amplification factor and subtracted from the output of the DAC 110. This error signal is filtered by an analog loop filter 120 and the analog loop filtered error signal is received at an analog-to-digital converter (ADC) 130. The output of the ADC 130 is then received at the pulse generator 140, which outputs a pulse train to the output driver 150. The analog loop filter is an active filter providing an integrating function. Details of portions of an example analog loop filter 120 are shown in FIGS. 2 and 3.

The DAC 110 is a current DAC. The ADC 130 is a successive approximation register (SAR) ADC. The pulse generator 140 generates a pulse train based on pulse-width modulation (PWM). The output driver 150 is a Class D amplifier that provides switching amplification (Class D amplification) with a high output resistance, operating in a current driving configuration. In some implementations the output driver 150 includes an H bridge. In some implementations the output driver 150 includes a low-pass filter at its output.

The digital sample value applied to the DAC changes at the sampling rate of the digital signal, which may typically be one of 8 KHz, 11.025 KHz, 16 KHz, 32 KHz, 44.056 KHz, 44.1 KHz, 48 KHz, and 96 KHz although it is not restricted to any of these sampling rates. At the sampling rate of the digital signal, the digital sample value changes to a next digital sample value in the sequence of digital sample values of the digital signal.

The feedback loop including analog loop filter 120, ADC 130, pulse generator 140 and output driver 150 operates at a loop frequency that is significantly higher than the sampling rate of the digital signal. The loop frequency may for example be at least 10, 20, 30, 40, 50 or 100 times greater than the sampling rate of the digital signal. The loop frequency may be 3 MHz for example. Since the loop frequency is so much higher than the sampling rate, the output driver 150 may change its output many times during the duration of a sample but, if the control loop is stable and suitably fast, a steady state output will be reached at which the output of the output driver 150 corresponds to an analog representation of the digital sample value. The loop frequency particularly affects digital elements of the feedback loop, such as the ADC 130 and pulse generator 140, which may respond to clock ticks at the loop frequency. For example, the ADC 130 may perform a sample-and-hold operation at each clock tick of the loop frequency and the pulse generator 140 may generate pulses at a frequency that is the loop frequency or at a frequency that is based partially or wholly on the loop frequency. A reason for operating the feedback loop at a loop frequency that is significantly greater (by at least one order of magnitude) than a sampling rate of a digital audio signal undergoing amplification is so that the analog loop filter 120 may have a high loop gain at audible frequencies (i.e., human-audible frequencies such as frequencies below approximately 20 KHz) to suppress noise and total harmonic distortion (THD) in that frequency band. But the high loop gain at the audible frequencies must be reduced to zero or negative gain by the Nyquist frequency of the loop frequency to avoid instability issues. By selecting a loop frequency that is one, two, three or more orders of magnitude greater than the sampling rate of the digital audio signal, a high loop gain (e.g., more than 50 dB, 60 dB, 70 dB, 80 dB, 90 dB, or 100 dB) may be achieved in the audible frequency band without requiring an excessively sharp roll-off to reduce the gain to zero dB by the Nyquist frequency of the loop frequency.

Nonetheless, even with these compromises, it has been recognized that relatively high frequency oscillations (e.g., greater than 50 KHz or greater than 100 KHz) in the output of the output driver 150 caused by high frequency switching may, particularly when the output driver 150 is operating in a high output resistance (i.e., current driving) configuration, cause an inductance in the loudspeaker 155 to present a significant impedance and the phase shifting effect of the inductance at these frequencies may have a significant effect on the stability of the feedback loop. In particular, the analog loop filter 120 may not function correctly as a result of the phase shifting effect, becoming unstable.

FIGS. 2 and 3 show portions of an analog loop filter 120. FIG. 2 shows five operational amplifiers (op-amps) cascaded together, each operating as integrators. The op-amps are shown as double-ended op-amps amplifying positive and negative inputs. A first op-amp 210 in the sequence has, for both positive and negative sides, respective feedback capacitors connecting an input and its output (positive output 212, negative output 214) as well as a respective input resistor between the loop filter input and the inputs of the op-amp. This sequence is repeated for the second op-amp 220, third op-amp 230, fourth op-amp 240, and fifth op-amp 250, wherein respective positive outputs 222, 232, 242, 252 are connected to respective positive inputs via respective feedback capacitors and respective negative outputs 224, 234, 244, 254 are also connected to respective negative inputs via respective feedback capacitors, and the positive and negative outputs of an op-amp are connected to the corresponding positive and negative inputs of the next op-amp via corresponding resistors. In addition, the positive output 232 of the third op-amp 230 is connected by a further feedback resistor to the negative input of the second op-amp 220 and the negative output 234 of the third op-amp 230 is connected by a further feedback resistor to the positive input of the second op-amp 220. In addition, the positive output 252 of the fifth op-amp 250 is connected by a further feedback resistor to the negative input of the fourth op-amp 240 and the negative output 254 of the fifth op-amp 250 is connected by a further feedback resistor to the positive input of the fourth op-amp 240.

FIG. 3 shows how the outputs of each of the five op-amp stages of FIG. 2 are combined to provide the output of the analog loop filter. An op-amp 260 has two inputs and two outputs, and combines multiple inputs in a summing configuration. A first input to the op-amp 260 is connected to node 270 via a first resistor, node 271 via a second resistor, node 272 via a third resistor, node 273 via a fourth resistor, and node 274 via a fifth resistor. The first input to the op-amp 260 is also connected to a first output 261 via a first loop resistor. A second input to the op-amp 260 is connected to node 275 via a sixth resistor, node 276 via a seventh resistor, node 277 via an eighth resistor, node 278 via a ninth resistor, and node 279 via a tenth resistor. The second input to the op-amp 2260 is also connected to a second output via a second loop resistor. Nodes 270 to 279 are connected to the outputs of the op-amps in FIG. 2 as follows: node 270 is connected to output 212 of the first op-amp 210, node 271 is connected to output 224 of the second op-amp 220, node 272 is connected to output 232 of the third op-amp 230, node 273 is connected to output 244 of the fourth op-amp 240, node 274 is connected to output 252 of the fifth op-amp 250, node 275 is connected to output 214 of the first op-amp 210, node 276 is connected to output 222 of the second op-amp 220, node 277 is connected to output 234 of the third op-amp 230, node 278 is connected to output 242 of the fourth op-amp 240, and node 279 is connected to output 254 of the fifth op-amp 250. Therefore the summing op-amp 260 combines the outputs of each stage of the five-op-amp chain of FIG. 2 in an alternating fashion to account for the inverting effect of each integrator stage in the chain. Appropriate selection of resistor values allows for the inputs to be combined equally or in a weighted fashion to meet particular filtering requirements according to an application.

The analog loop filter 120 provides a high loop gain at audible frequencies to suppress noise and total harmonic distortion (THD). For example, the analog loop filter may provide an 80 to 100 dB gain in the audible frequency band. But the analog loop filter's gain reduces to a negative dB gain by the Nyquist frequency of the loop frequency, i.e., 1.5 MHz if the loop frequency is 3 MHz. This high gain combined with a sharp roll-off places high demands on the analog loop filter and makes it susceptible to instability if the phase margin is reduced due to the effect of the inductance of the loudspeaker at high frequencies.

The analog loop filter is not required to take the form as shown in FIGS. 2 and 3. An active filter that provides amplification at low frequency such as the audible frequency band combined with rejection or suppression at high frequencies, such as beyond the Nyquist frequency of the loop, may suffice. For example, a single op-amp acting as a low-pass filter or integrator may be sufficient, or any number of combined op-amps, chained as in FIG. 2 or in parallel. The active filter may also be implemented without op-amps but using instead alternative technologies such as transistors or other components capable of amplification.

Figure 4:
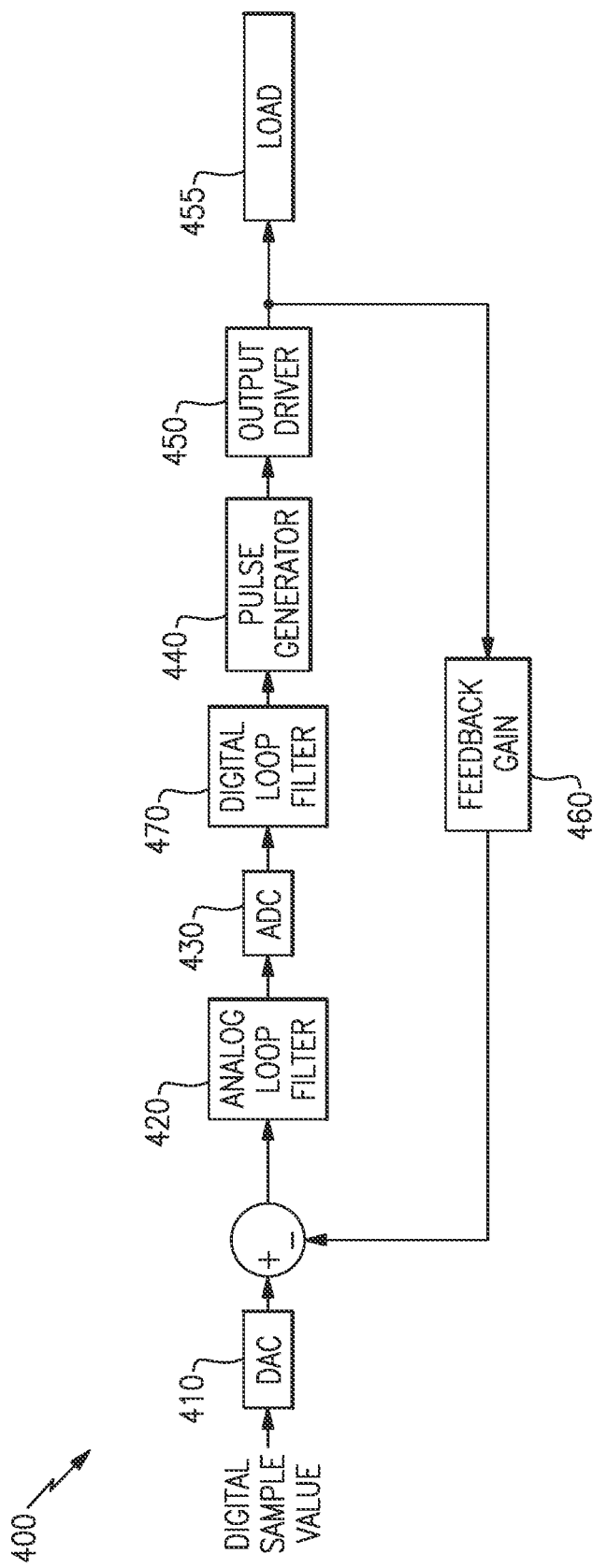
FIG. 4 is a block diagram of a feedback-controlled amplifier according to aspects of the present disclosure.

FIG. 4 shows a block diagram of an amplifier 400 in accordance with the techniques of this disclosure. It includes a DAC 410, analog loop filter 420, ADC 430, pulse generator 440, output driver 450, a load 455, such as loudspeaker and feedback gain 460 as with the amplifier 100 shown in FIG. 1, wherein each of these elements may be the same as corresponding element of the amplifier 100 shown in FIG. 1.

In accordance with the techniques of this disclosure, the amplifier 400 additionally includes a digital loop filter 470 located in the loop between the ADC 430 and the pulse generator 440. The ADC 430 converts the output of the analog loop filter 420 into a digital value at the loop frequency (e.g., 3 MHz) leading to a sequence of digital values, each corresponding to a clock tick at the loop frequency. The digital loop filter 470 performs digital filtering on this sequence of digital values. The digital loop filter 470 may include one or more finite impulse response (FIR) filters or one or more infinite impulse response filters (IIR) or may include one or more FIR filters and one or more IIR filters in combination.

The purpose of the digital loop filter 470 is to wholly or partially offset the effect of the inductance of the load 455 or loudspeaker at high frequencies. For example, if the inductance of the load 455 leads to phase issues and instability at certain frequencies, such as frequencies between 80 KHz and 500 KHz, the digital loop filter 470 may reduce the phase-shifting effect at these frequencies by providing its own phase-shifting effect at these frequencies. If the inductance of the load 455 results in an unwanted large impedance at certain frequencies, such as between 80 KHz and 500 KHz, then this may place an unwanted demand on the output driver when operating in a high output resistance (current driving) operational mode—the digital loop filter 470 may provide an amplification effect at these frequencies to reduce the impedance effect of the inductance in the load 455, e.g., the loudspeaker at these frequencies.

The digital loop filter 470 may provide one or both of phase adjustment and amplification. The one or both of phase adjustment and amplification may be provided at relatively high frequencies beyond a cut-off or corner frequency in the configuration of a high-pass filter, or in the form of a band-pass filter configured to provide the one or both of phase adjustment and amplification over a frequency range.

The choice of the cut-off frequency or the frequency range over which the digital loop filter 470 provides one or both of phase adjustment and amplification may be based on the frequency response and stability of the analog loop filter 420 and optionally may further depend on the inductance of the load 455, e.g., a loudspeaker that is either coupled to the output driver 450 or configured to be coupled to the output driver 450 in use.

In some examples the cut-off frequency or frequency range at which the one or both of phase adjustment and amplification is provided is dependent on the frequency response of the analog loop filter 420. If the analog loop filter 420 experiences or is susceptible to instability in a particular frequency range, then the digital loop filter 470 may be configured to provide one or both of phase adjustment and amplification in that particular frequency range. For example, if the analog loop filter experiences or is susceptible to instability at frequencies beyond a first frequency such as 80 KHz due to an inductance of the coupled load 455, the digital loop filter 470 may be configured to provide one or both of phase adjustment and amplification at frequencies beyond the first frequency. Optionally if the analog loop filter 420 does not amplify signals or noise at frequencies greater than a second frequency such as 500 KHz, then there may be no need for the digital loop filter 470 to perform one or both of phase adjustment and amplification at frequencies beyond the second frequency. Therefore the digital loop filter 470 may be configured to provide one or both of phase adjustment and amplification at frequencies beyond a first frequency, and may be configured to only provide the one or both of phase adjustment and amplification at frequencies up to a second frequency that is greater than the first frequency. For example, if the analog loop filter 420 experiences or is susceptible to instability in the frequency range of 80 KHz to 500 KHz, then the digital loop filter 470 may be configured to perform one or both of phase adjustment and amplification in a frequency range that corresponds at least approximately to the instability frequency range of the analog loop filter 420, i.e., corresponds at least approximately to 80 KHz to 500 KHz, and preferably wholly encompasses the instability frequency range of the analog loop filter, i.e., preferably wholly encompasses the 80 KHz to 500 KHz range. For example, each of the lower and upper bound frequencies of the frequency range at which the digital loop filter 470 performs the one or both of phase adjustment and amplification may be within 20% of the respective upper and lower bound frequencies of the instability frequency range of the analog loop filter 420, more preferably within 10%, and more preferably within 5%.

A cut-off frequency or lower bound of the frequency range may be greater than a sampling rate of an audio signal to be amplified such as any sampling rate of an audio signal as mentioned herein, or greater than a multiple of the sampling rate (e.g., greater than 2×, 3×, 4×, 5×, 6×, 7×, 8×, 9×, 10×, 12×, 15×, or 20× the sampling frequency), or greater than 20 KHz, greater than 30 KHz greater than 40 KHz, greater than 50 KHz, greater than 60 KHz, greater than 60 KHz, greater than 70 KHz, greater than 80 KHz, greater than 90 KHz, greater than 100 KHz, greater than 150 KHz, greater than 200 KHz, greater than 300 KHz, or greater than 500 KHz.

Where the digital loop filter 470 has a maximum frequency at which the one or both of phase adjustment and amplification is provided, the maximum frequency of the frequency range may be limited by the Nyquist frequency of the loop, or the frequency range may be less than some fraction of the Nyquist frequency of the loop, such as less than 5%, 10%, 20%, 30%, 40%, 50%, 60%, 70%, 80%, 90% or 100% of the Nyquist frequency of the loop (i.e., 2.5% of the loop frequency, 5% of the loop frequency, 10% of the loop frequency, 15% of the loop frequency, 20% of the loop frequency, 25% of the loop frequency, 30% of the loop frequency, 35% of the loop frequency, 40% of the loop frequency, or 45% of the loop frequency), or the frequency range may be less than 50 KHz, 70 KHz, 100 KHz, 200 KHz, 300 KHz, 500 KHz, 700 KHz, 1000 KHz, 1200 KHz, or 1500 KHz.

One implementation of the digital loop filter 470 that may provide one or both of phase adjustment and amplification at higher frequencies, such as a frequency range that is higher than a sampling rate of the digital signal being amplified, is a digital filter configured as a first-order high-pass filter, with appropriate choice of gain and cut-off or corner frequency according to the demands of the application, such as the inductance of the load and optionally taking into account any other properties of the circuitry. Such a digital loop filter may be implemented as an FIR filter or an IIR filter. Other implementations of a digital loop filter 470 to provide the one of phase adjustment and amplification may be a digital filter with an order greater than one, two, three or higher and/or a digital band-pass filter.

Figure 7:
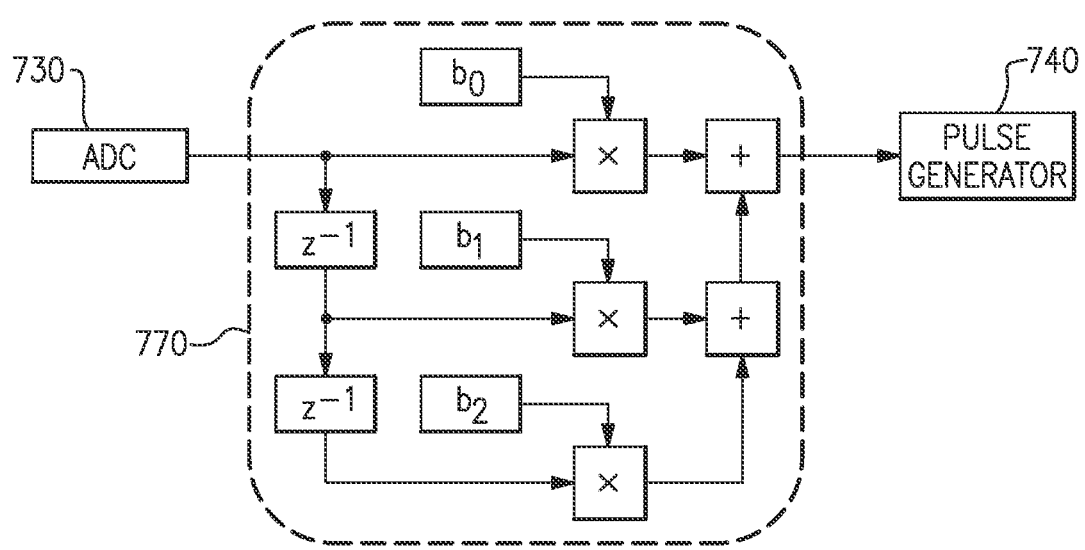
FIG. 7 is a block diagram of a portion of a feedback-controlled amplifier according to aspects of the present disclosure, the block diagram illustrating a digital loop filter.
Figure 8:
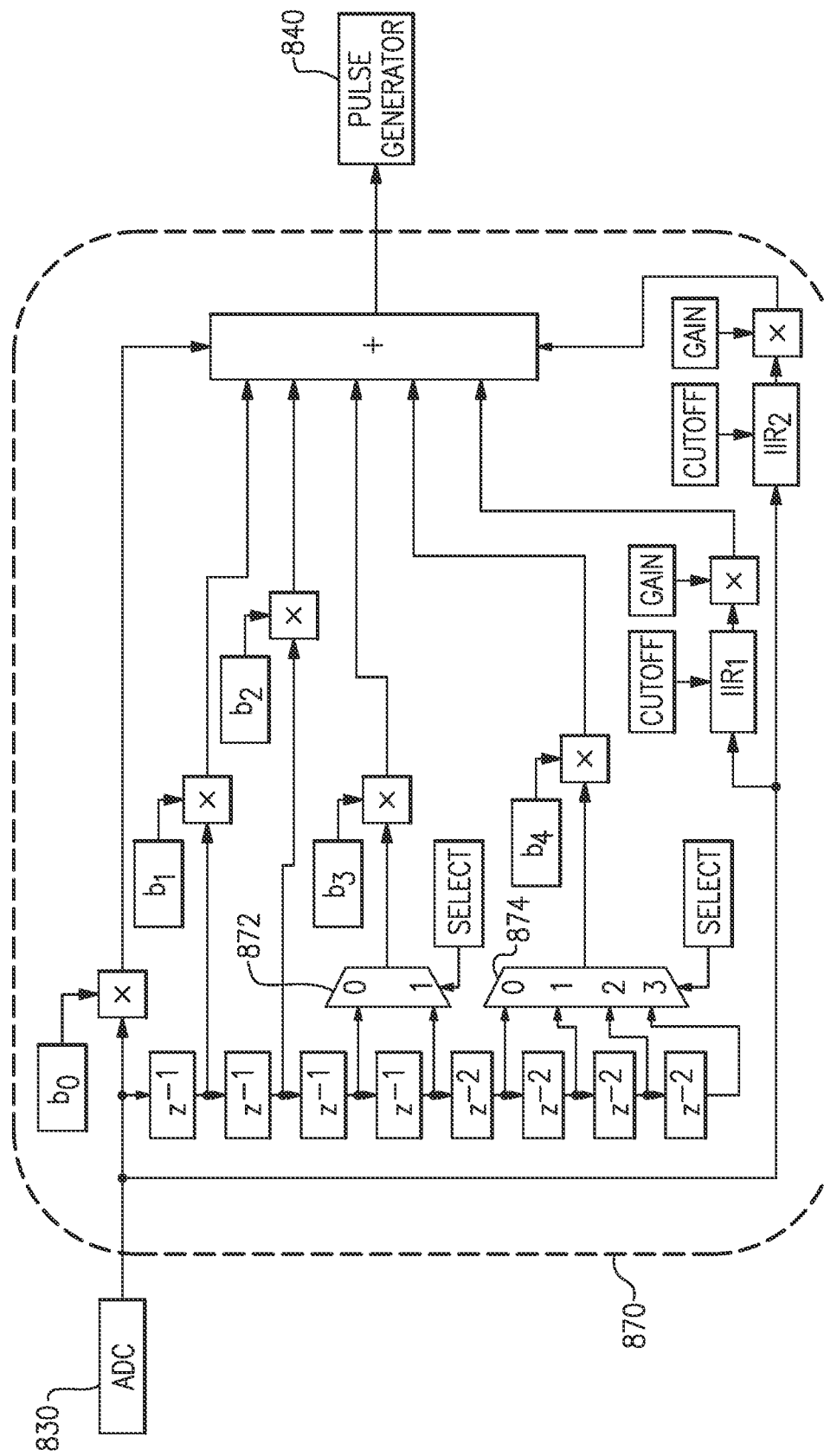
FIG. 8 is a block diagram of a portion of a feedback-controlled amplifier according to aspects of the present disclosure, the block diagram illustrating a digital loop filter

FIGS. 7 and 8, discussed below, provide examples of digital loop filters that may be implemented as the digital loop filter 470 in an amplifier such as the amplifier 400 of FIG. 4 in accordance with the techniques of this disclosure.

Figure 5:
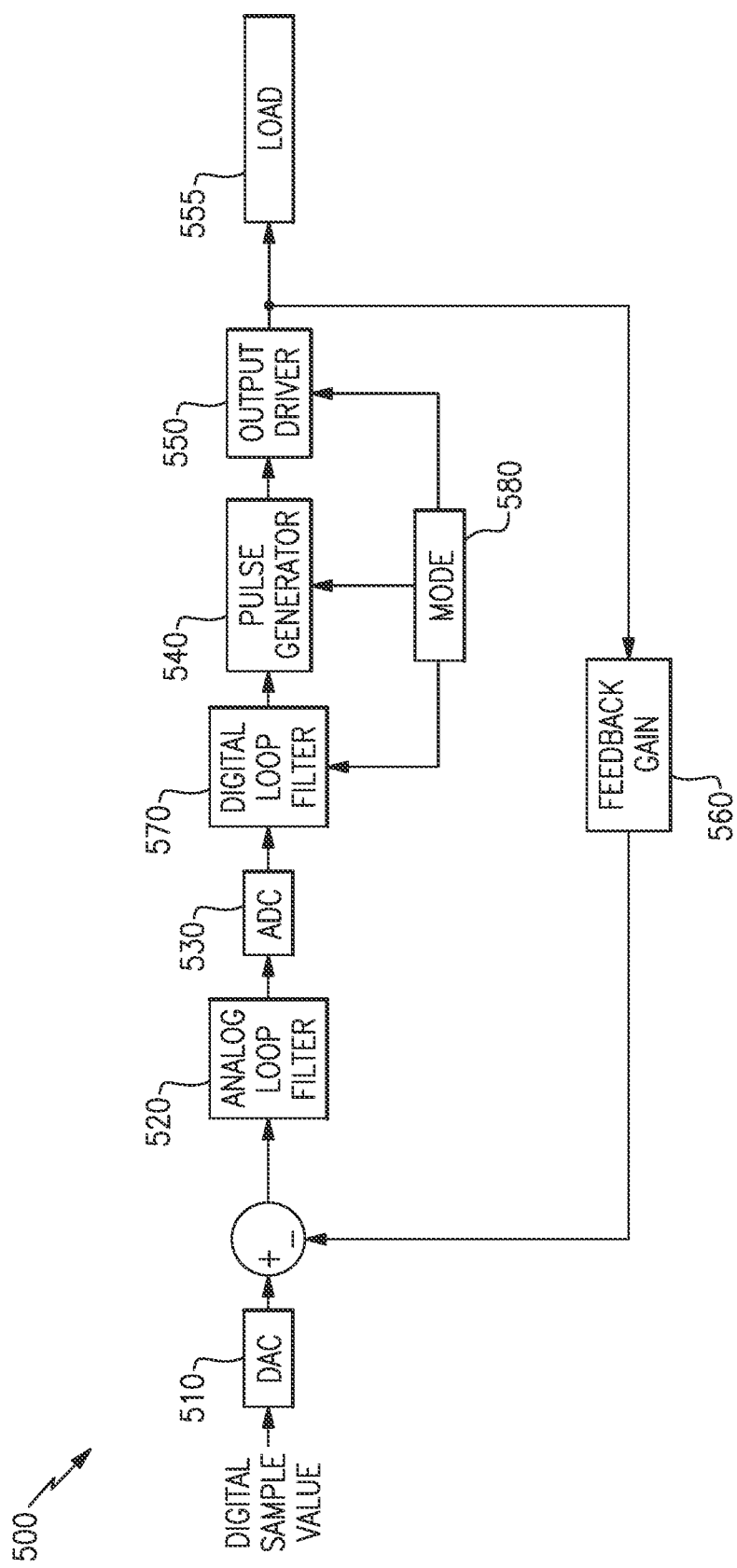
FIG. 5 is a block diagram of a feedback-controlled amplifier according to aspects of the present disclosure.

FIG. 5 shows a block diagram of an amplifier 500 in accordance with the techniques of this disclosure. It includes a DAC 510, analog loop filter 520, ADC 530, pulse generator 540, digital loop filter 570, output driver 550, load 555 such as a loudspeaker, and feedback gain 560 as with the amplifier 400 shown in FIG. 4, although at least some of these elements include additional or different functionality as described below.

The output driver 550 differs from the output driver 450 of the amplifier 400 shown in FIG. 4 in that the output driver 550 can be operated in more than one mode. The amplifier 450 of FIG. 4 is operated in a high output resistance (current driving) mode. The output driver 550 can be operated in a high output resistance (current driving) mode but can also be operated in a low or zero output resistance (voltage driving) mode.

It is noted that the output driver 550 operating in a high output resistance (current driving or current source) mode results in a lower noise level and so such an operating mode is desirable at low audio levels. It is also noted that the efficiency of the output driver 550 operating in the high output resistance mode is lower than when operating in a low or zero output resistance (voltage driving or voltage source) mode. Therefore in some circumstances it may be desirable to operate the output driver 550 in the high output resistance mode but in other circumstances it may be desirable to operate the output driver 550 in the low or zero output resistance mode. In the amplifier 500 of FIG. 5, the output driver 550 may be switched between a first mode in which the output driver 550 has a high output resistance and operates as a current source and a second mode in which the output driver 550 has a low or zero output resistance and operates as a voltage source.

In accordance with the techniques of this disclosure, the amplifier 400 additionally includes a mode selection signal 580 that is provided to the digital loop filter 570, the pulse generator 540 and the output driver 550. The mode selection signal 580 instructs the output driver 550 to operate in one of a plurality of operating modes that include a high output resistance mode and a low or zero output resistance mode. Based on this signal, the output driver 550 operates in the selected operating mode.

The output driver 550 may also be configured to operate in more than two operating modes. For example, the output driver 550 may be configured to operate in the aforementioned high output resistance operating mode and the low or zero resistance operating modes and one or more additional operating modes in which the output resistance is intermediate between the high output resistance and the low or zero output resistance. In such intermediate output resistance modes the output driver may function partly as a current driver and partly as a voltage driver. The plurality of operating modes may include one intermediate output resistance mode or multiple intermediate output resistance modes, each at different intermediate output resistances and representing a different combination of current driver and voltage driver functionality. In some applications a particular intermediate mode may be selected to provide an optimal balance between noise level and efficiency for that application. In other applications, the one or more intermediates may be used to switch between the high output resistance mode and the low or zero output resistance mode while the amplifier 500 using one or more intermediate steps while the amplifier is amplifying a signal and providing the amplified output to the load 555, e.g., a loudspeaker. Use of the one or more intermediate steps may make any transient glitch on mode change less perceptible to a recipient, e.g., listener than a direct switch between the high output resistance mode and the low or zero output resistance mode.

The mode selection signal 580 is provided to the digital loop filter 570. This is because it has been recognized that the effect of the inductance of the load 555, e.g. a loudspeaker on the stability of the analog loop filter 520 is less when the output driver 550 is operating a low or zero operating mode than when the output driver 550 is operating in a high output resistance mode. Therefore different degrees of digital loop filtering may be required depending on the operating mode.

The digital loop filter 570 operates differently depending on the operating mode indicated by the mode selection signal 580. For example, some implementations may require no digital filtering when the output driver 550 is operating in the low or zero output resistance mode, in which case the digital filter may be set by the mode selection signal 580 to operate in a pass-through mode without any filtering. For each intermediate operating mode, the digital filter may provide the same filtering as for the low or zero output resistance mode, the same filtering as for the high output resistance mode, or an intermediate filtering that is intermediate between the filtering for the high output resistance mode and low or zero output resistance mode. For example, if the digital filter is configured to provide a first particular amount of phase adjustment and gain at a particular frequency or frequency range for the high output resistance mode, and to provide a second particular amount of phase adjustment and gain for the low or zero output resistance mode (such as zero phase adjustment and gain for pass-through filtering), the digital filter may be configured to provide an intermediate amount of phase adjustment and gain at the particular frequency or frequency range.

By way of example, in some implementations, the digital loop filter 570 contains multiple filter pathways that each provide different filtering, the input signal samples received from the ADC 530 being directed to a different filtering pathway depending on the operating mode. In other implementations, the digital loop filter 570 includes a single filter pathway but filters differently depending on the operating mode, such as by using one or more switches to select elements of the digital filter depending on the operating mode as indicated by the mode selection signal 580.

It may not be necessary to provide the mode selection signal 580 to the pulse generator 540, although in the amplifier 500 of FIG. 5 the mode selection signal 580 is provided to the pulse generator 540. This enables the pulse generator 540 to use knowledge of the operating mode in which the output driver 550 has been instructed to operate in its generation of the pulse train to control the output driver 550.

The mode selection signal 580 may be provided by a mode switching controller as described in U.S. application Ser. No. 16/926,680 filed Jul. 11, 2020, titled CIRCUITS, DEVICES AND METHODS RELATED TO MODE-SWITCHING OF AMPLIFIERS, and published as US 2021/0012763 A1, of which the entire contents are hereby incorporated by reference into the present disclosure.

FIG. 7 is a block diagram of a digital loop filter 770 in accordance with the techniques of this disclosure. The digital loop filter is in a path between an ADC 730 and a pulse generator 740. The digital loop filter 770 comprises a three-tap FIR filter, in which a current sample value and two previous sample values are multiplied by respective coefficients to obtain three product values, which are then summed together and provided as an output to the pulse generator.

The digital loop filter incorporates two $z^{-1}$ delays, which may for example be implemented using first-in-first-out (FIFO) storage such as shift registers or a circular buffer. At each clock tick of the loop filter frequency, the ADC 730 obtains a new digital value and the two previous digital values are stored temporarily by the $z^{-1}$ delays. A first digital value, which is the digital value output by the ADC 730, is multiplied by a first filter coefficient, $b_0$, to obtain a first product. A second digital value, which is the digital value that immediately preceded the first digital value at the immediately preceding clock tick, is multiplied by a second filter coefficient, $b_1$, to obtain a second product. A third digital value, which is the digital value that immediately preceded the second digital value, is multiplied by a third filter coefficient, $b_2$, to obtain a third product. The second and third products are added together and this sum is added to the first product to obtain the output of the digital loop filter 770, which is provided to the pulse generator 740.

The coefficients $b_0$, $b_1$, $b_2$ for the three-tap FIR filter may be obtained using standard FIR design methods that will be familiar to the skilled reader, such as the Window method, the Frequency Sampling method, the Least Minimum Square Error Method, or the Parks-McClellan method, among others.

If an implementation requires the three-tap FIR filter to perform high-pass filtering with amplification, such as when implemented to reduce the effects of load or loudspeaker inductance at a certain frequency or range of frequencies, then a desired frequency response may be used with standard FIR design methods to obtain coefficients for the three-tap FIR filter. The desired frequency response may be calculated based on known inductance-driven effects of a particular loudspeaker, or based on a modelled loudspeaker having a particular inductance, which may in turn be measured from a physical loudspeaker.

If an implementation of the three-tap FIR filter is intended not to perform any filtering, such as when it is filtering feedback for an output driver operating in a zero or low output resistance mode, then the first coefficient $b_0$ may be set to a value of one and the other coefficients $b_1$, $b_2$ may be set to zero—with such coefficients the output from the digital loop filter 770 to the pulse generator 740 is the same as the input received from the ADC 730.

The coefficients $b_0$, $b_1$, $b_2$ for the three-tap FIR filter may also be obtained using an optimization process in which the behavior of all of the amplifier components including the analog loop filter is simulated, with an optimization goal of maintaining at least a minimum phase margin for stability of the analog loop filter, and optionally a further optimization goal of minimizing output noise in the circuits.

The coefficients $b_0$, $b_1$, $b_2$ for the three-tap FIR filter may also be obtained using an optimization process performed for a particular amplifier connected to a particular load or loudspeaker, once again with an optimization goal of maintaining at least a minimum phase margin for stability of the analog loop filter, and optionally a further optimization goal of minimizing output noise in the circuits.

It has been noted however that implementations of the three-tap FIR filter with coefficients to provide a high-pass filtering effect to increase phase margin and reduce attenuation at particular frequency or over a particular frequency range may cause unwanted amplification or peaking at other frequencies such as higher frequencies than the particular frequency or frequency range. Therefore a digital loop filter employing a greater number of taps may provide better control over unwanted peaking in the frequency response.

FIG. 8 shows a block diagram of a digital loop filter 870 in accordance with the techniques of this disclosure, where the digital loop filter 870 employs a greater number of taps than the digital loop filter 770 shown in FIG. 7. The digital loop filter 870 of FIG. 8 includes a sparse five-tap FIR filter and two simple IIR filters and filters a digital signal received from the ADC 830 and provides the filtered digital signal as output to the pulse generator 840.

The sparse five-tap filter includes coefficients $b_0$, $b_1$, $b_2$, $b_3$, and $b_4$, which are used to obtain first, second, third, fourth and fifth products respectively. The sparse five-tap filter includes multiple $z^{-1}$ and $z^{-2}$ delays, which may be implemented using FIFO storage such as shift registers or a circular buffer. Four $z^{-1}$ delays are connected in sequence, followed in sequence by four $z^{-2}$ delays to provide digital sample values $x_0$, $x_{-1}$, $x_{-2}$, $x_{-3}$, $x_{-4}$, $x_{-6}$, $x_{-8}$, $x_{-10}$, and $x_{-12}$, where xi represents the ADC value at a given clock tick i at the loop frequency, and i=0 represents a current clock tick, and i=−1 represents the clock tick immediately preceding the current clock tick.

The first product is equal to $x_0$ multiplied by $b_0$. The second product is equal to $x_{-1}$ multiplied by $b_1$. The third product is equal to $x_{-2}$ multiplied by $b_2$. The first, second and third products are summed provide a portion of the output of the digital loop filter 870. The first, second and third products summed together represent the same three-tap filter as shown in FIG. 7, but the five-tap FIR filter of the digital loop filter 870 of FIG. 8 includes further sparse taps—i.e., the sequence of digital signal values that are multiplied by coefficients does not include all of the digital signal values in the range $-12 \le i \le 0$.

The fourth product is equal to one of $x_{-3}$ and $x_{-4}$ multiplied by $b_3$. The particular one of $x_{-3}$ and $x_{-4}$ is selectable when configuring the filter and represents a further degree of freedom when designing the digital loop filter.

The fifth product is equal to one of $x_{-6}$, $x_{-8}$, $x_{-10}$, and $x_{-12}$ multiplied by $b_4$. The particular one of $x_{-6}$, $x_{-8}$, $x_{-10}$, and $x_{-12}$ is also selectable when configuring the filter and represents a further degree of freedom when designing the digital loop filter.

The fourth and fifth products are summed with the first, second and third products to provide further portion of the output of the digital loop filter 870.

The digital loop filter 870 further includes first and second IIR filters, $IIR_1$ and $IIR_2$, which provide further filtering according to respective selectable gains and cut-off or corner frequencies. Each of the first and second IIR filters $IIR_1$ and $IIR_2$ may function as one of: a low-pass filter, a high-pass filter, a band-pass filter, and a band-stop filter. In some implementations, each of the first and second IIR filters $IIR_1$ and $IIR_2$ function as a same type of filter selected from a low-pass filter, a high-pass filter, a band-pass filter, and a band-stop filter, albeit with different cut-off or corner frequencies and/or different gains.

Some implementations of a digital loop filter according to the techniques of this disclosure may include a sparse FIR filter such as the sparse FIR filter of the digital loop filter 870 shown in FIG. 8 but either omit one or both of the IIR filters shown in FIG. 8 or include one or more additional IIR filters beyond those shown in FIG. 8.

Some implementations of a digital loop filter according to the techniques of this disclosure may include a sparse FIR filter such as a five-tap sparse FIR filter that differs from that of FIG. 8 in that the additionally or alternatively a greater or lesser number of the locations of the sparse taps in the delay sequence are fixed, such as a sparse FIR filter in which all of the locations of the sparse taps in the delay sequence are fixed.

Some implementations of a digital loop filter according to the techniques of this disclosure may include an FIR filter with a greater number of taps than that of FIG. 7 but the FIR filter is not sparse, such as a five-tap non-sparse FIR filter.

The use an FIR filter with a greater number of taps than that of FIG. 7, and particularly the use of a sparse filter as shown in FIG. 8, means that greater control can be had over the frequency response and peaking can be controlled by, for example, reducing gain at the highest frequencies.

Figure 9:
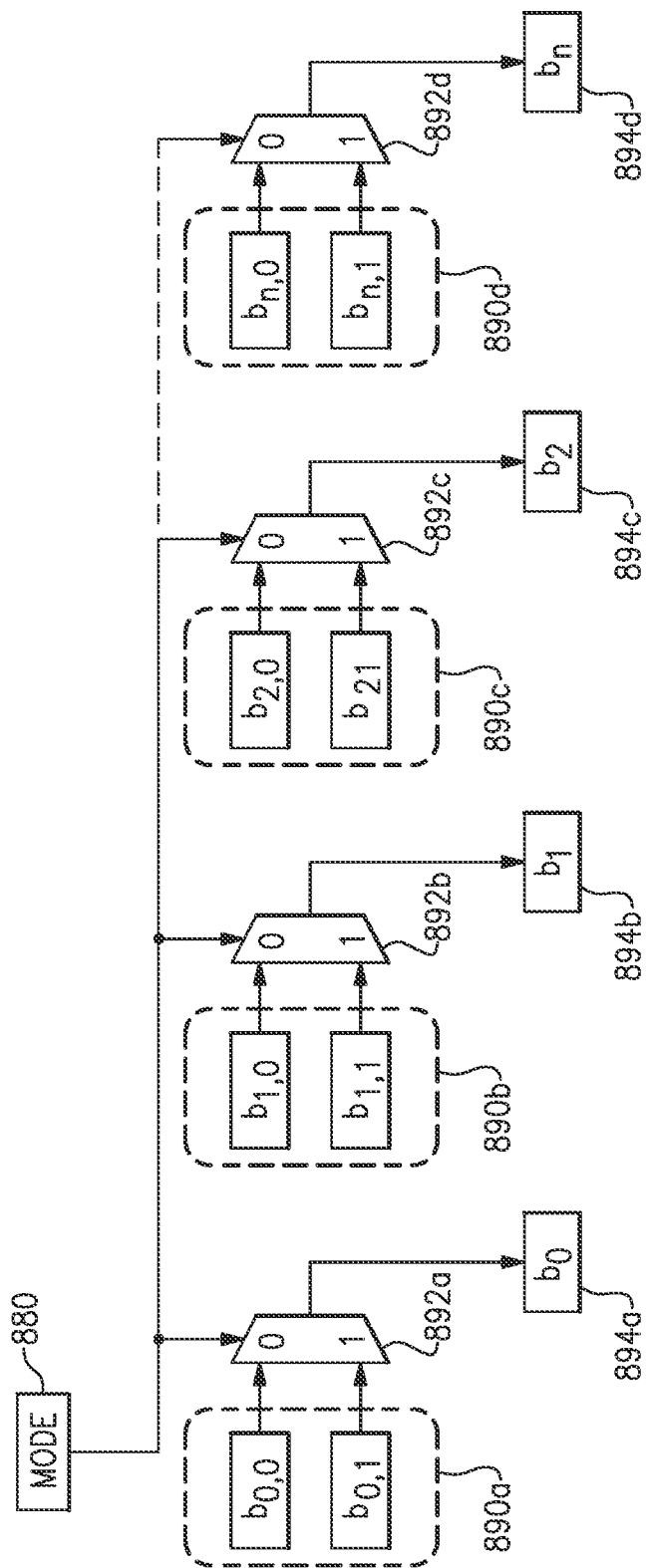
FIG. 9 is a block diagram of a system for selectable operation of a digital loop filter according to aspects of the present disclosure.

FIG. 9 shows a block diagram of a further portion of an amplifier according to the techniques of this disclosure, which may optionally be included in any of the above-described digital loop filters or provided separately to the digital loop filter, in which multiple values (e.g., $b_{0,0}$, $b_{0,1}$) are stored in a storage 890 for each coefficient (e.g., $b_0$) used in the digital loop filter. For coefficient $b_0$, a portion 890a of storage 890 stores values $b_{0,0}$, $b_{0,1}$. Depending on the operating mode indicated by a mode selection signal 880, a different one of the potential stored coefficient values is transferred by switch 892a to register 894a for use as the coefficient $b_0$. Similar storage portions 890b-d provide potential coefficient values selected by switches 892b-d to provide coefficients $b_0$, $b_1$, . . . , and $b_n$ for registers 894b-d. The storage portions 890a-d contain two potential values for each coefficient. The mode selection signal 880 is a binary value, indicating one of two modes, such as a high output resistance operating mode and a zero or low output resistance operating mode.

In this way, a digital loop filter as described herein, such as a digital loop filter as shown FIG. 7 or FIG. 8, may be configured to perform digital filtering differently according to the operating mode of the amplifier, such as performing high-pass filtering for a high output resistance operating mode and a lower amount of high-pass filtering or even no high-pass filtering for a zero or low output resistance operating mode. In this example the number of stored coefficient values per coefficient matches the number of operating modes but in some implementations the number of stored coefficient values per coefficient may be less than the number of operating modes, where the same coefficient values (and same digital filtering behavior) is used for more than one operating mode.

Figure 10:
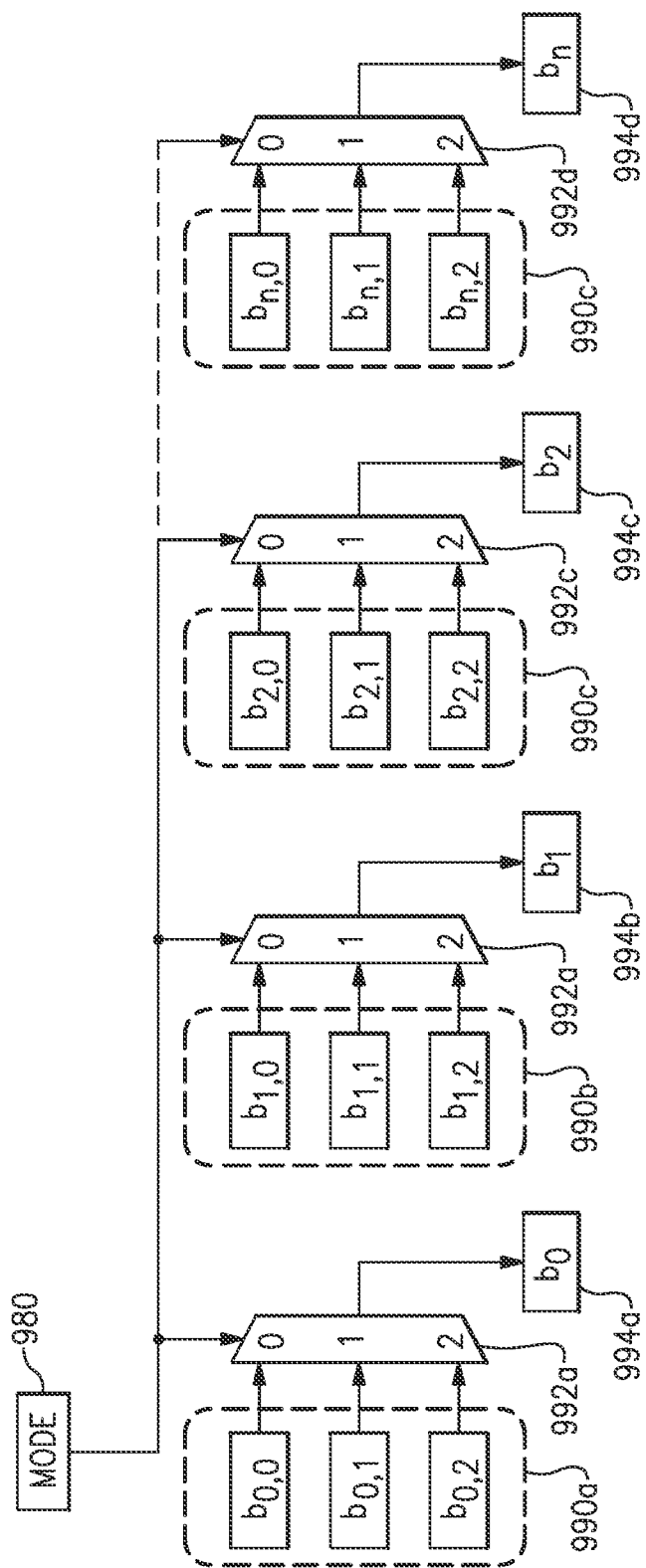
FIG. 10 is a block diagram of a further system for selectable operation of a digital loop filter according to aspects of the present disclosure.

FIG. 10 shows another block diagram of a further portion of an amplifier according to the techniques of this disclosure, which may optionally be included in any of the above-described digital loop filters or provided separately to the digital loop filter, in which more than two values (e.g., $b_{0,0}$, $b_{0,1}$, $b_{0,2}$) are stored in a storage 990 for each coefficient (e.g., $b_0$) used in the digital loop filter. For coefficient $b_0$, a portion 990a of storage 990 stores values $b_{0,0}$, $b_{0,1}$, $b_{0,2}$. Depending on the operating mode indicated by a mode selection signal 980, a different one of the potential stored coefficient values is transferred by switch 992a to register 994a for use as the coefficient $b_0$. Similar storage portions 990b-d provide potential coefficient values selected by switches 992b-d to provide coefficients $b_0$, $b_1$, . . . and $b_n$ for registers 994b-d. The storage portions 990a-d contain two potential values for each coefficient. The mode selection signal 980 is not a binary value. It indicates one of three modes, such as a high output resistance operating mode and a zero or low output resistance operating mode and an intermediate output resistance mode.

In this way, a digital loop filter as described herein, such as a digital loop filter as shown FIG. 7 or FIG. 8, may be configured to perform digital filtering differently according to the operating mode of the amplifier, such as performing high-pass filtering for a high output resistance operating mode and a lower amount of high-pass filtering or even no high-pass filtering for a zero or low output resistance operating mode and an intermediate amount of high-pass filtering for an intermediate output resistance operating mode. In this example the number of stored coefficient values per coefficient matches the number of operating modes but in some implementations the number of stored coefficient values per coefficient may be less than the number of operating modes, where the same coefficient values (and same digital filtering behavior) is used for more than one operating mode.

Figure 6:
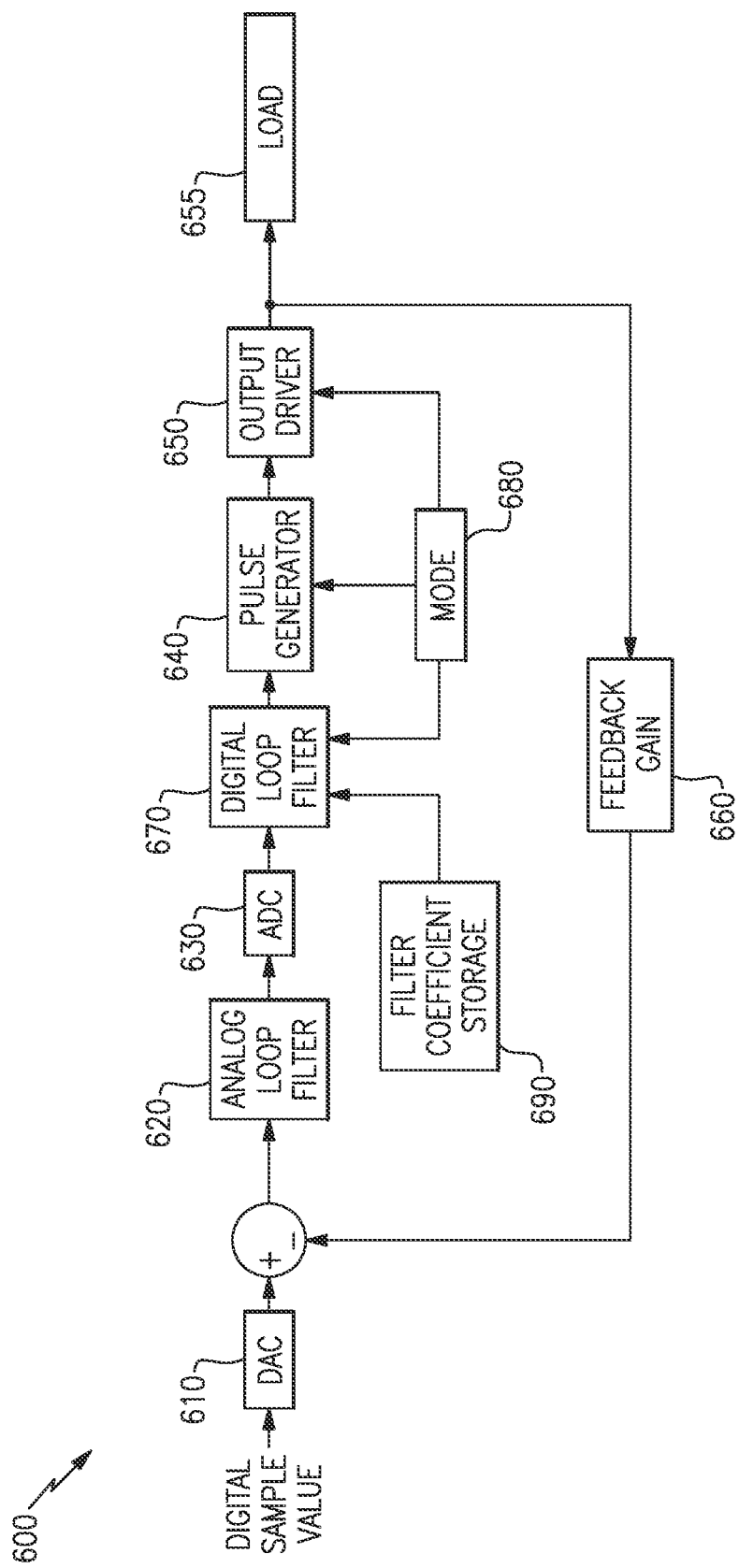
FIG. 6 is a block diagram of a feedback-controlled amplifier according to aspects of the present disclosure.

Referring back to FIG. 6, a block diagram of an amplifier 600 in accordance with the techniques of this disclosure is illustrated that is similar to the amplifier 500 of FIG. 5, but which includes filter coefficient storage 690. As with the amplifier 500 of FIG. 5, the amplifier 600 includes a DAC 610, an analog loop filter 620, ADC 630, a pulse generator 640, an output driver 650, a load 655, such as a loudspeaker, a feedback gain 660, a digital loop filter 670, and a mode selection signal 680. However, in addition to these elements, the amplifier 600 further includes filter coefficient storage for storing any of the filter coefficients to be used with any of the digital loop filters shown in FIGS. 7 and 8. The filter coefficient storage 690 may be used to store multiple sets of digital loop filter coefficients associated with multiple operating modes of the amplifier in a manner similar to that discussed above with respect to FIGS. 9 and 10, including a high output resistance (current driving) mode, a low or zero output resistance (voltage driving) mode, or intermediary modes in which the output resistance is intermediate between the high output resistance and the low or zero output resistance.

Upon receiving the mode select signal 680, the digital loop filter 670 may access the filter coefficient storage 690 to obtain mode specific filter coefficient values for the digital loop filter 670. In alternative embodiments (not shown) the mode select signal may also be provided to the filter coefficient storage such that mode specific filter coefficient values are automatically loaded into the digital loop filter in response to the mode select signal. The filter coefficients selected may, dependent on the mode select signal, provide little to no digital filtering and phase adjustment when the output driver 650 is operating in the low or zero output resistance mode, may provide a maximum level of digital filtering and phase adjustment when the output driver 650 is operating in the high output resistance mode, and intermediate levels of digital filter and phase adjustment when the output driver 650 is operating in modes intermediate between the high output resistance mode and low or zero output resistance mode.

In accordance with a number of implementations, an amplifier having one or more features described herein may be implemented in a chip scale package or module, which may comprise a packaging substrate configured to receive a plurality of components including components of an amplifier according to the techniques of this disclosure including a digital loop filter according to the techniques of this disclosure.

Figure 11:
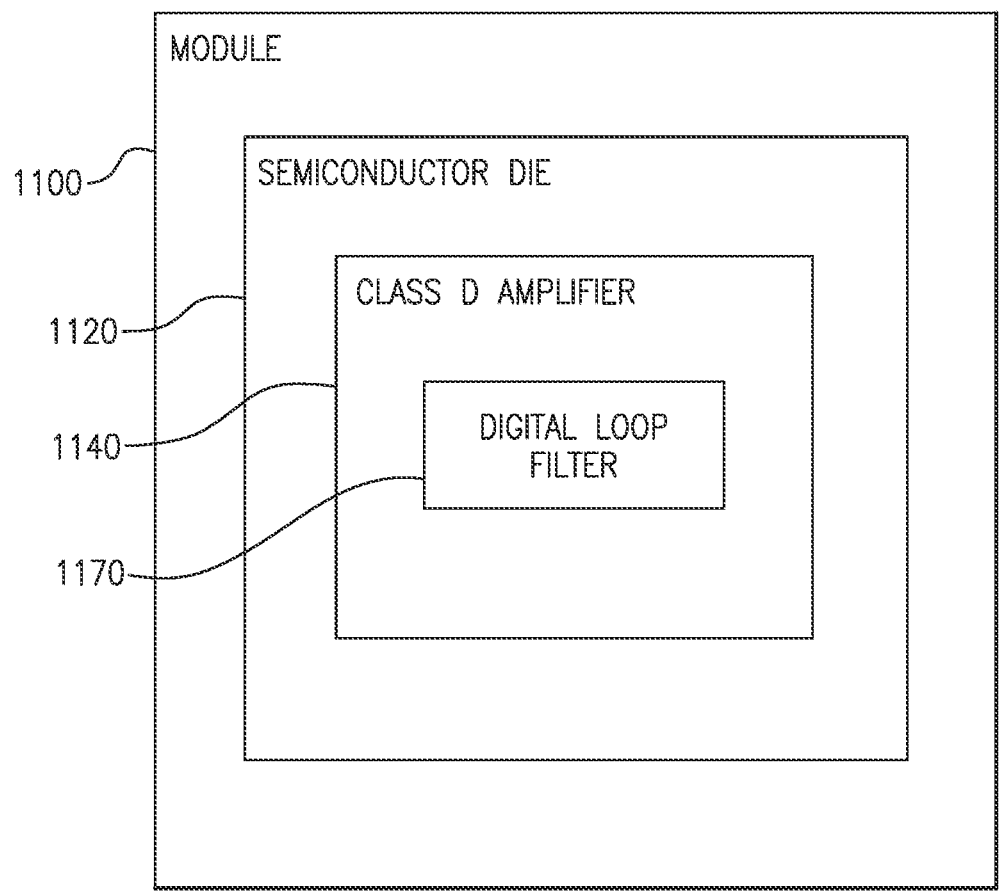
FIG. 11 is a block diagram of a module according to aspects of the present disclosure.

FIG. 11 shows a block diagram of a module 1100 that includes a semiconductor die 120 that includes an amplifier 1140 in accordance with the techniques of this disclosure. The amplifier 1140 includes a digital loop filter 1170 in accordance with the techniques of this disclosure. The module 1100 does not include a load, such as a loudspeaker but the output of the amplifier may be connected to a load, such as a loudspeaker in use.

Other modules in accordance with the techniques of this disclosure may additionally include a load, e.g., a loudspeaker. The loudspeaker may be mounted on the same semiconductor die or otherwise included in the same module as the amplifier, the output of the amplifier connected to the loudspeaker.

In accordance with some implementations, an amplifier having one or more features described herein such as a digital loop filter as described herein may be implemented in an electronic device.

Figure 12:
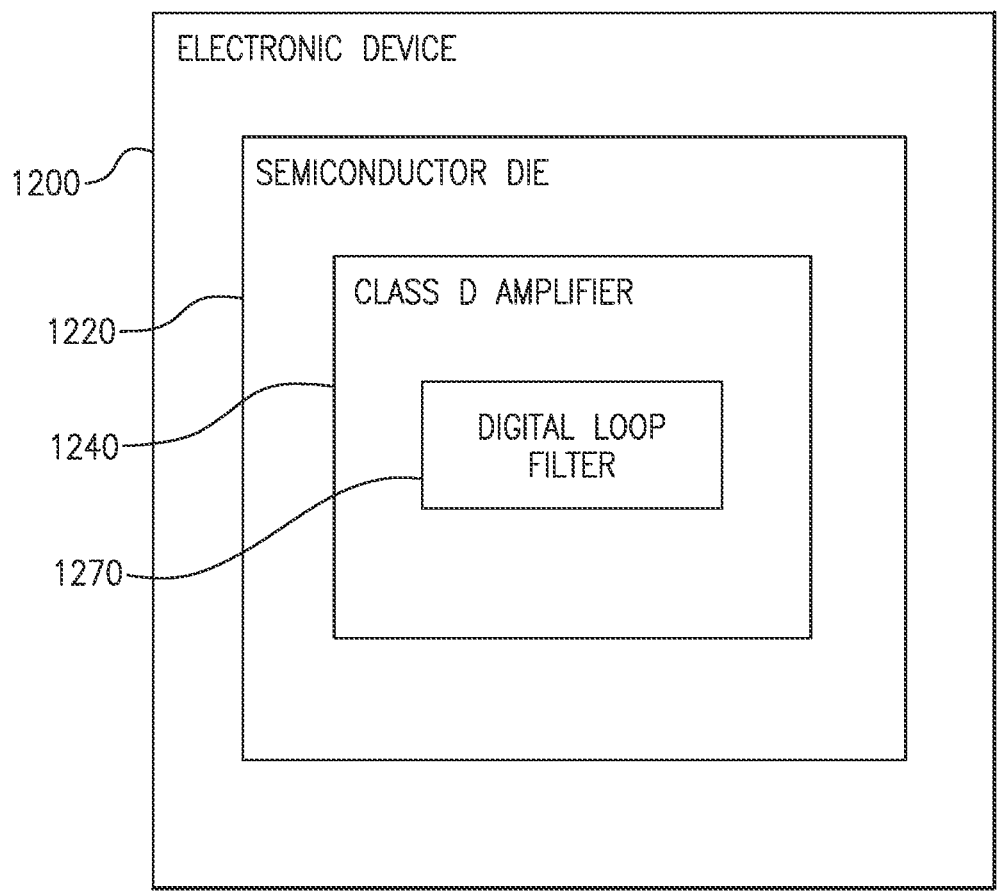
FIG. 12 is a block diagram of an electronic device according to aspects of the present disclosure.

FIG. 12 shows an electronic device 1200 that includes a semiconductor die 1220 that includes an amplifier in accordance with the techniques of this disclosure. The amplifier 1240 includes a digital loop filter 1270 in accordance with the techniques of this disclosure. The semiconductor die 1220 may be included in a module, such as the module 1100 shown in FIG. 11.

The electronic device 1200 may comprise one or more loudspeakers (not shown in FIG. 12), the output of the amplifier connected to the one or more loudspeakers.

The electronic device 1200 may comprise any of a wide range of electronic devices such as a desktop computer, a laptop computer, a tablet computer, a telephone handset such as a so-called "smart" phone, a television, a camera, a digital media player, a video gaming console, or the like, or any electronic device including a loudspeaker.

The electronic device 1200 may comprise an audio device for use in combination with any of the above-mentioned electronic devices, such as wired or wireless loudspeaker(s) or headphone(s) for use with any of the above-mentioned electronic devices. For example, the electronic device may comprise wireless headphones such as wireless earphones (earbuds), in which an audio signal is transmitted to the wireless headphones via a wireless communications technology such as Bluetooth™.

Figure 13:
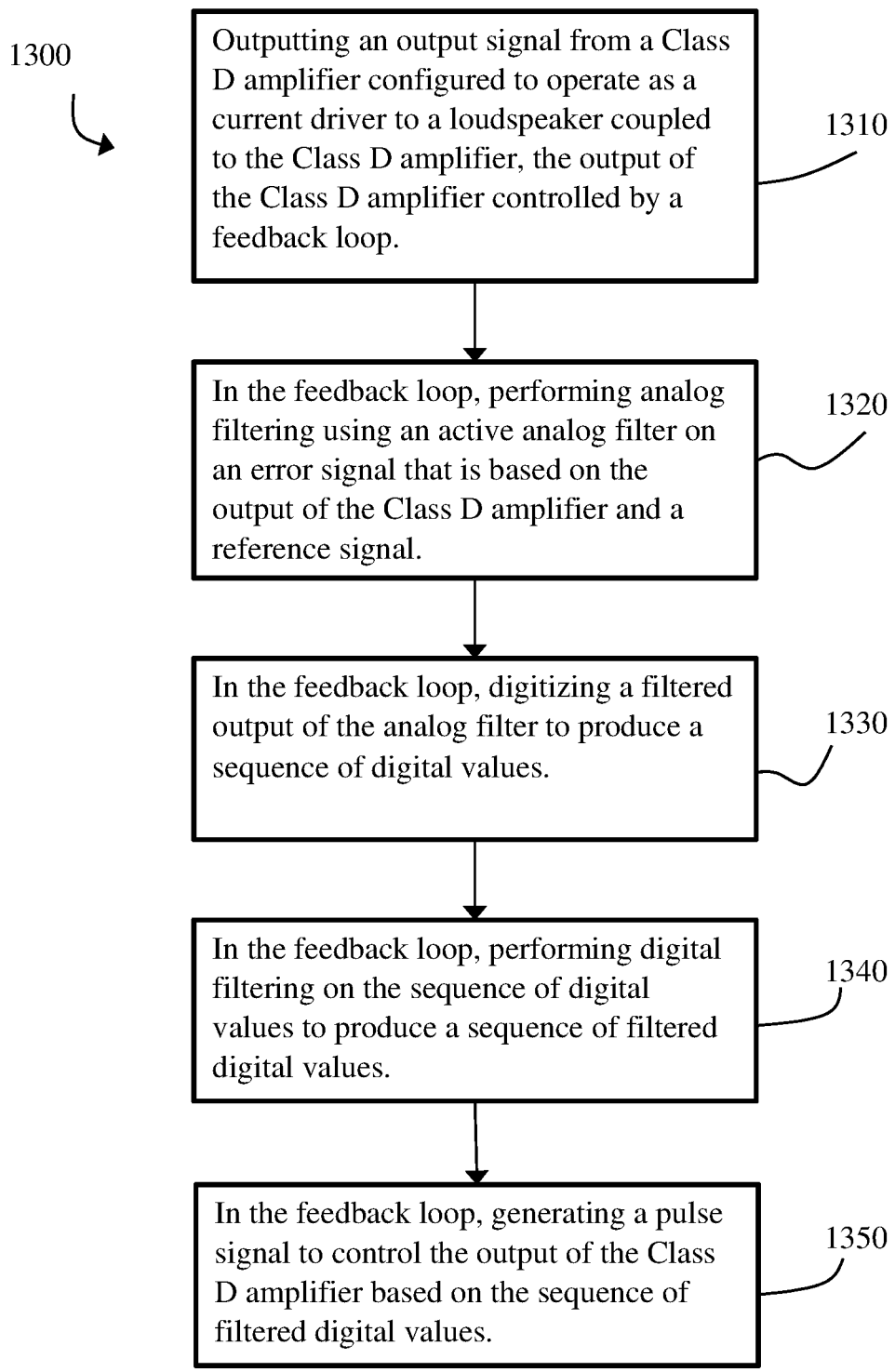
FIG. 13 is a flow diagram of a method according to aspects of the present disclosure.

FIG. 13 is a flow diagram of a method according to aspects of the present invention. FIG. 13 illustrates a method 1300 for amplifying an audio signal.

In a first step 1310, the method includes outputting an output signal from a Class D amplifier configured to operate as a current driver to a loudspeaker coupled to the Class D amplifier, the output of the Class D amplifier controlled by a feedback loop. The Class D amplifier may be an output driver as described herein. The Class D amplifier may be configured to operate in a plurality of operating modes including a current driving operating mode in which the Class D amplifier has a relatively high output resistance and a voltage driving operating mode in which the Class D amplifier has a relatively low output resistance, the operating mode of the Class D amplifier being selectable. The plurality of operating modes may further include one or more intermediate modes in which the Class D amplifier has an output resistance that is intermediate between the relatively high output resistance of the current driving operating mode and the relatively low output resistance of the voltage driving operating mode.

In a second step 1320, the method includes, in the feedback loop, performing analog filtering using an active analog filter on an error signal that is based on the output of the Class D amplifier and a reference signal. Performing analog filtering may include performing amplification and low-pass filtering. The active analog filter may be an analog loop filter as described herein and may optionally be an analog loop filter as shown in FIGS. 2 and 3.

In a third step 1330, the method includes, in the feedback loop, digitizing a filtered output of the analog filter to produce a sequence of digital values. The digitizing of the filtered output of the analog filter may be performed by an ADC as described herein. The digitizing may be performed at a loop frequency of the feedback loop.

In a fourth step 1340, the method includes, in the feedback loop, performing digital filtering on the sequence of digital values to produce a sequence of filtered digital values. The digital filtering may be performed by a digital loop filter as described herein. The digital loop filtering may be performed at a loop frequency of the feedback loop. Performing digital filtering may include performing one or both of amplification and phase adjustment over a frequency range and may particularly include one or both of: i) performing phase adjustment over a frequency range to reduce an effect of a phase adjustment arising from an inductance of the loudspeaker, and ii) performing amplification over a frequency range to reduce an effect of an impedance arising from the inductance of the loudspeaker over the frequency range. The frequency range may be a range of frequencies that is greater than one or more of: 20 KHz, 30 KHz, 40 KHz, 50 KHz, 60 KHz, 70 KHz, 80 KHz, 90 KHz, 100 KHz, 150 KHz, 200 KHz, 300 KHz, and 500 KHz.

In a fifth step 1350, the method includes, in the feedback loop, generating a pulse signal to control the output of the Class D amplifier based on the sequence of filtered digital values. The generating of the pulse signal may be performed by a pulse generator as described herein. The pulse generation may be performed at a loop frequency of the feedback loop.

While FIG. 13 presents these steps as an ordered sequence, neither the order or sequence is essential. These steps may be performed in an order other than as set out in FIG. 13. And some or all of these steps may be performed by an amplifier simultaneously.

The method 1300 may further include changing the operating mode of the Class D amplifier to a different operating mode than the current driving operating mode and performing digital filtering differently when the Class D amplifier is operating in the different operating mode than when the Class D amplifier is operating in the current driving operating mode.

Changing the operating mode of the Class D amplifier may include changing the operating mode to the voltage driving operating mode. Performing digital filtering differently when the class D amplifier is operating in the voltage driving operating mode may include performing a lower amount of one or both of amplification and phase adjustment than when the Class D amplifier is operating in the current driving mode.

The method 1300 may also further include changing the operating mode of the Class D amplifier from the current driving operating mode to an intermediate operating mode.

Performing digital filtering at step 1340 may include performing digital filtering using one or more FIR filters and/or one or more IIR filters that multiply values of the sequence of digital values by coefficient values. Performing digital filtering differently when the Class D amplifier is operating in the different operating mode than when the Class D amplifier is operating in the current driving operating mode may include selecting different coefficient values for an FIR filter or IIR filter when the Class D amplifier is operating in the different operating mode from coefficient values used when the Class D amplifier is operating in the current driving operating mode. The selecting of different coefficient values for an FIR or IIR filter may be as shown in FIGS. 9 and 10.

The techniques of this disclosure may be implemented using separate negative and positive circuitry for analog signals. The analog loop filter shown in FIGS. 2 and 3 includes separate negative and positive circuitry, i.e., the analog loop filter is a dual rail analog filter. An output driver may feature an H bridge to provide dual rail (both positive and negative) output. Such a configuration may be advantageous in some applications, such as when the amplifier is operating from a battery supply in which only a limited voltage is available.

The techniques of this disclosure may also be implemented using a single rail for analog signals. A single analogue output may be provided by the output driver and the analog loop filter may operate on the single analog output. In such implementations the output driver may include a half bridge rather than an H bridge (full bridge).

It should be appreciated that aspects of the present disclosure are not limited to Class D amplifiers used in audio applications, but may be used in other applications as well. For example, aspects of the present disclosure may be used in any amplifier where the impedance of the load may vary dependent on operating conditions. For example, aspects of the present disclosure may be used in RF and wireless LAN communications where the impedance of the load (e.g., the antenna) may vary greatly dependent on operating conditions. Examples of RF applications including H bridge output drivers are described, for example in U.S. Pat. No. 7,649,958, which is incorporated by reference herein in its entirety.

Having described above several aspects of at least one embodiment in accordance with the techniques of this disclosure, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An amplifier circuit comprising:
   a Class D amplifier configured to operate as a current driver, the Class D amplifier having an output for coupling to a load;
   an analog loop filter configured to perform active filtering on an error signal that is based on the output of the Class D amplifier and a reference signal, the analog loop filter producing a filtered output;
   an analog-to-digital converter configured to produce a sequence of digital values based on the filtered output of the analog loop filter;
   a digital loop filter configured to perform digital filtering on the sequence of digital values to produce a sequence of filtered digital values; and
   a pulse generator configured to provide a pulse signal to the Class D amplifier to control the output of the Class D amplifier based on the sequence of filtered digital values.

2. The amplifier circuit of claim 1 wherein the analog loop filter is configured to perform amplification and low-pass filtering.

3. The amplifier circuit of claim 2 wherein the digital loop filter is configured to perform one or both of amplification and phase adjustment over a frequency range.

4. The amplifier circuit of claim 3 wherein the digital loop filter is configured to provide a phase adjustment to, when the output of the Class D amplifier is coupled to a loudspeaker, reduce an effect of a phase adjustment arising from an inductance of the loudspeaker.

5. The amplifier circuit of claim 3 wherein the digital loop filter is configured to provide an amplification over a frequency range to reduce, when the output of the Class D amplifier is coupled to a loudspeaker, the effect of an impedance arising from the inductance of the loudspeaker over the frequency range.

6. The amplifier circuit of claim 3 wherein:
   the Class D amplifier is configured to amplify a digital audio signal that includes a plurality of digital sample values associated with a sampling frequency, and
   a lower bound of the frequency range over which the digital loop filter is configured to perform one or both of amplification and phase adjustment is greater than the sampling frequency.

7. The amplifier circuit of claim 6 wherein the sampling frequency is one of: 8 KHz, 11.025 KHz, 16 KHz, 32 KHz, 44.056 KHz, 44.1 KHz, 48 KHz, and 96 KHz.

8. The amplifier circuit of claim 6 wherein an upper bound of the frequency range over which the digital loop filter is configured to perform one or both of amplification and phase adjustment is greater than or equal to an upper bound of a frequency range over which the analog loop filter has a gain that is greater than unity.

9. The amplifier circuit of claim 6 wherein the analog-to-digital converter, the digital loop filter and the pulse generator are configured to operate at a loop frequency that is greater than the sampling frequency.

10. The amplifier circuit of claim 9 wherein the loop frequency is between 500 KHz and 1 MHz or between 1 MHz and 1.5 MHz or between 1.5 and 2 MHz or between 2 MHz and 2.5 MHz or between 2.5 and 3 MHz or between 3 MHz and 4 MHz or between 4 MHz and 5 MHz or between 5 MHz and 7 MHz or between 7 MHz and 10 MHz or between 10 MHz and 20 MHz or between 20 MHz and 50 MHz.

11. The amplifier circuit of claim 9 wherein an upper bound of the frequency range over which the digital loop filter is configured to perform one or both of amplification and phase adjustment is less than 50% of the loop frequency.

12. The amplifier circuit of claim 1 wherein the Class D amplifier is configured to operate in a plurality of operating modes including a current driving operating mode in which the Class D amplifier has a relatively high output resistance and a voltage driving operating mode in which the Class D amplifier has a relatively low output resistance, the operating mode of the Class D amplifier being selectable.

13. The amplifier circuit of claim 12 wherein the plurality of operating modes includes one or more intermediate modes in which the Class D amplifier has an output resistance that is intermediate between the relatively high output resistance of the current driving operating mode and the relatively low output resistance of the voltage driving operating mode.

14. The amplifier circuit of claim 12 wherein the digital loop filter is configured to perform different digital loop filtering depending on the operating mode in which the Class D amplifier is configured to operate.

15. The amplifier circuit of claim 14 wherein the digital loop filter is configured not to perform digital loop filtering if the Class D amplifier is configured to operate in the voltage driving operating mode.

16. The amplifier circuit of claim 14 wherein the digital loop filter and the Class D amplifier are each configured to receive a mode selection signal to control filtering behavior of the digital loop filter and the operating mode of the Class D amplifier.

17. The amplifier circuit of claim 14 wherein the digital loop filter includes one or more finite impulse response (FIR) filters that perform digital filtering based on a plurality of coefficient values.

18. The amplifier circuit of claim 17 wherein the digital loop filter is configured to select coefficient values for the one or more FIR filters based on the operating mode of the Class D amplifier.

19. The amplifier circuit of claim 18 wherein the plurality of coefficient values are determined based on the inductance of a particular loudspeaker to be coupled to the output of the Class D amplifier.

20. The amplifier circuit of claim 19 wherein the plurality of coefficient values are determined by an optimization process based on minimizing a total noise level in the amplifier output while maintaining a minimum phase margin for stability of the analog loop filter while the output of the Class D amplifier is coupled to a loudspeaker.

21. The amplifier circuit of claim 17 wherein the one or more FIR filters includes one of a three-tap FIR filter, a five tap filter, a sparse FIR filter, and an infinite impulse response (IIR) filter.

22. The amplifier circuit of claim 1 wherein the analog loop filter includes one or more operational amplifiers configured as integrators and wherein the analog loop filter is a fifth-order filter including a sequence of five operational amplifiers configured as integrators.

23. The amplifier circuit of claim 1 wherein the Class D amplifier is an H Bridge having a dual rail output to separately output positive and negative amplified signal values.

24. A module comprising an amplifier circuit that includes:
a Class D amplifier configured to operate as a current driver, the Class D amplifier having an output for coupling to a load;
an analog loop filter configured to perform active filtering on an error signal that is based on the output of the Class D amplifier and a reference signal, the analog loop filter producing a filtered output;
an analog-to-digital converter configured to produce a sequence of digital values based on the filtered output of the analog loop filter;
a digital loop filter configured to perform digital filtering on the sequence of digital values to produce a sequence of filtered digital values; and
a pulse generator configured to provide a pulse signal to the Class D amplifier to control the output of the Class D amplifier based on the sequence of filtered digital values.

25. An electronic device comprising:
a loudspeaker;
a Class D amplifier configured to operate as a current driver, the Class D amplifier having an output coupled to a loudspeaker;
an analog loop filter configured to perform active filtering on an error signal that is based on the output of the Class D amplifier and a reference signal, the analog loop filter producing a filtered output;
an analog-to-digital converter configured to produce a sequence of digital values based on the filtered output of the analog loop filter;
a digital loop filter configured to perform digital filtering on the sequence of digital values to produce a sequence of filtered digital values; and
a pulse generator configured to provide a pulse signal to the Class D amplifier to control the output of the Class D amplifier based on the sequence of filtered digital values.

* * * * *